United States Patent
Greenlee et al.

(10) Patent No.: US 11,476,332 B2
(45) Date of Patent: Oct. 18, 2022

(54) INTEGRATED ASSEMBLIES, AND METHODS OF FORMING INTEGRATED ASSEMBLIES

(71) Applicant: Micron Technology, Inc., Boise, ID (US)

(72) Inventors: Jordan D. Greenlee, Boise, ID (US); John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 16/890,296

(22) Filed: Jun. 2, 2020

(65) Prior Publication Data
US 2021/0376083 A1    Dec. 2, 2021

(51) Int. Cl.
| | | |
|---|---|---|
| *H01L 29/08* | (2006.01) | |
| *H01L 27/11519* | (2017.01) | |
| *H01L 27/11524* | (2017.01) | |
| *H01L 27/11582* | (2017.01) | |
| *H01L 27/11565* | (2017.01) | |

(Continued)

(52) U.S. Cl.
CPC ...... *H01L 29/0847* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 9,748,265 | B1* | 8/2017 | Lee .................. H01L 23/5329 |
| 2018/0006052 | A1 | 1/2018 | Hwang |
| 2018/0076218 | A1 | 3/2018 | Choi |

(Continued)

FOREIGN PATENT DOCUMENTS

| | | |
|---|---|---|
| CN | 110634874 A | 12/2019 |
| TW | 201816938 A | 5/2018 |

(Continued)

OTHER PUBLICATIONS

Sievila, et al., "The fabrication of silicon nanostructures by focused-ion-beam implantation and TMAH wet etching", Nanotechnology vol. 21, Mar. 10, 2010, United Kingdom, pp. 1-6.

*Primary Examiner* — Hsien Ming Lee
(74) *Attorney, Agent, or Firm* — Wells St. John P.S.

(57) ABSTRACT

Some embodiments include an integrated assembly having a source structure. The source structure includes, in ascending order, a first conductively-doped semiconductor material, one or more first insulative layers, a second conductively-doped semiconductor material, one or more second insulative layers, and a third conductively-doped semiconductor material. The source structure includes blocks extending through the second conductively-doped semiconductor material. Conductive levels are over the source structure. Channel material extends vertically along the conductive levels, and extends into the source structure to be in direct contact with the second conductively-doped semiconductor material. One or more memory cell materials are between the channel material and the conductive levels. Some embodiments include methods of forming integrated assemblies.

28 Claims, 25 Drawing Sheets

(51) Int. Cl.
*H01L 27/1157* (2017.01)
*H01L 27/11556* (2017.01)

(56) References Cited

U.S. PATENT DOCUMENTS

| | | |
|---|---|---|
| 2018/0366486 A1 | 12/2018 | Hada |
| 2019/0157294 A1 | 5/2019 | Kanamori |
| 2019/0326315 A1 | 10/2019 | Lee |
| 2019/0355742 A1 | 11/2019 | Maruyama |
| 2020/0006375 A1 | 1/2020 | Zhou |
| 2020/0235112 A1* | 7/2020 | Howder ............ H01L 27/11524 |

FOREIGN PATENT DOCUMENTS

| | | |
|---|---|---|
| TW | 202016995 A | 5/2020 |
| WO | WO PCT/US2021/030850 | 8/2021 |

* cited by examiner

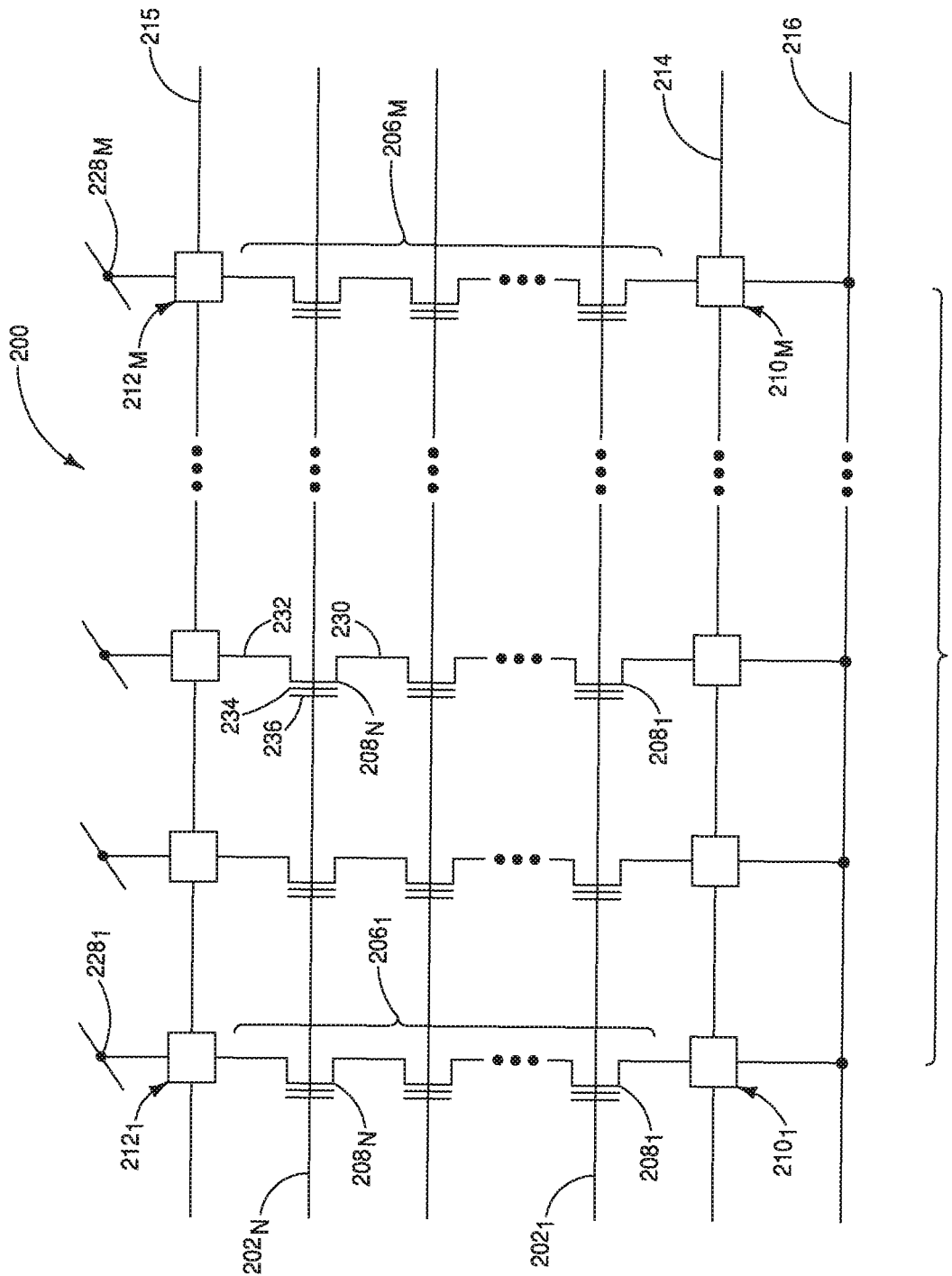

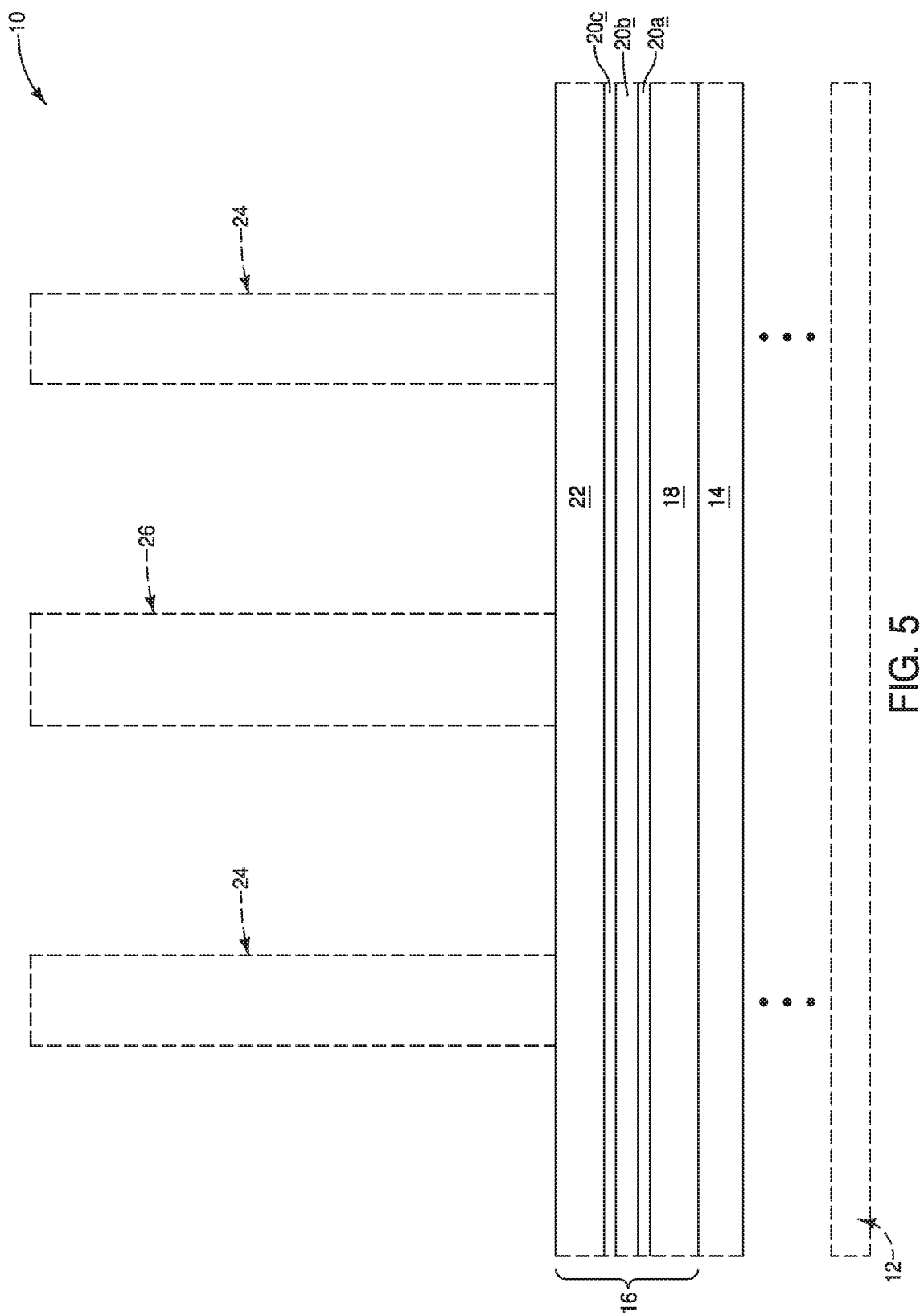

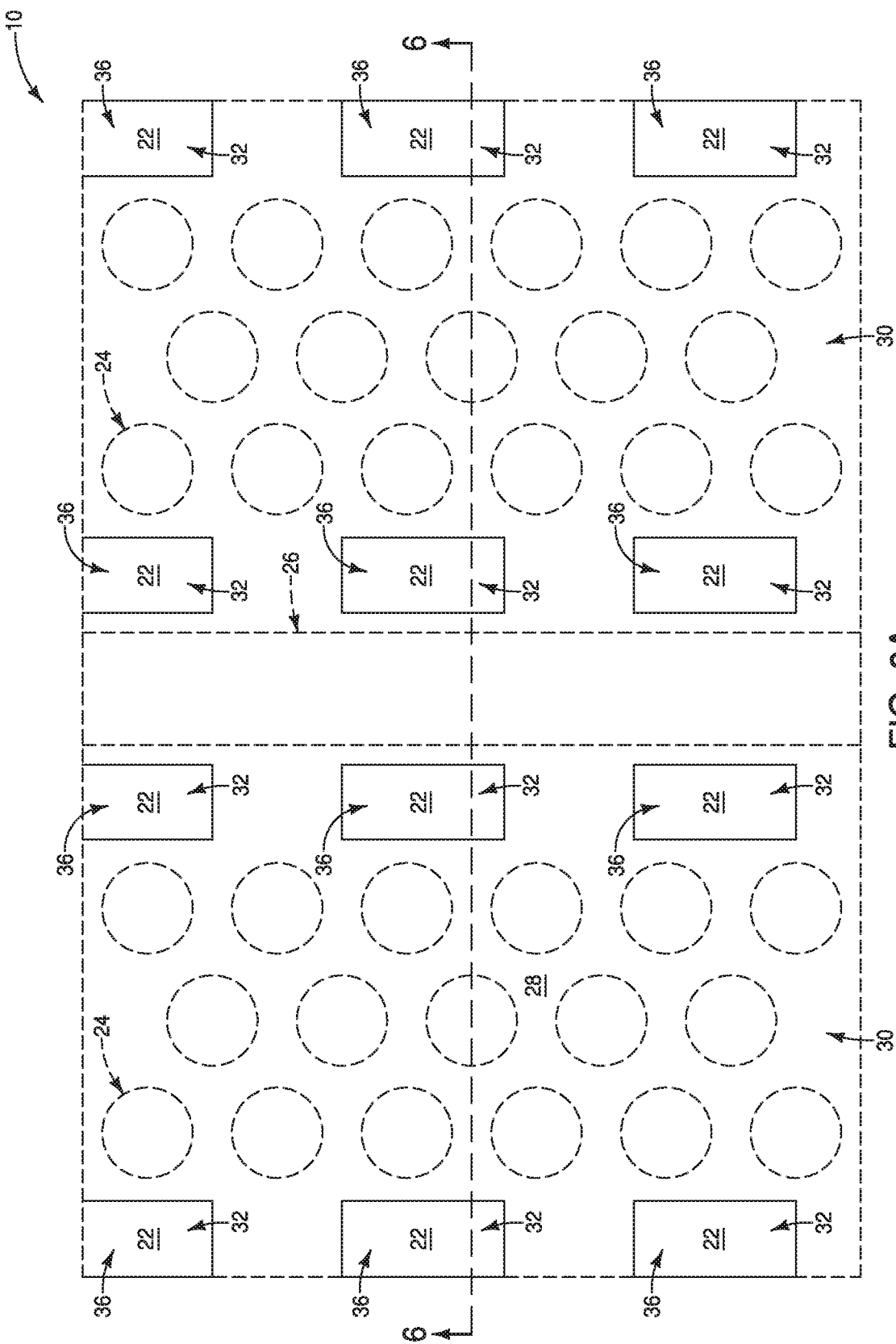

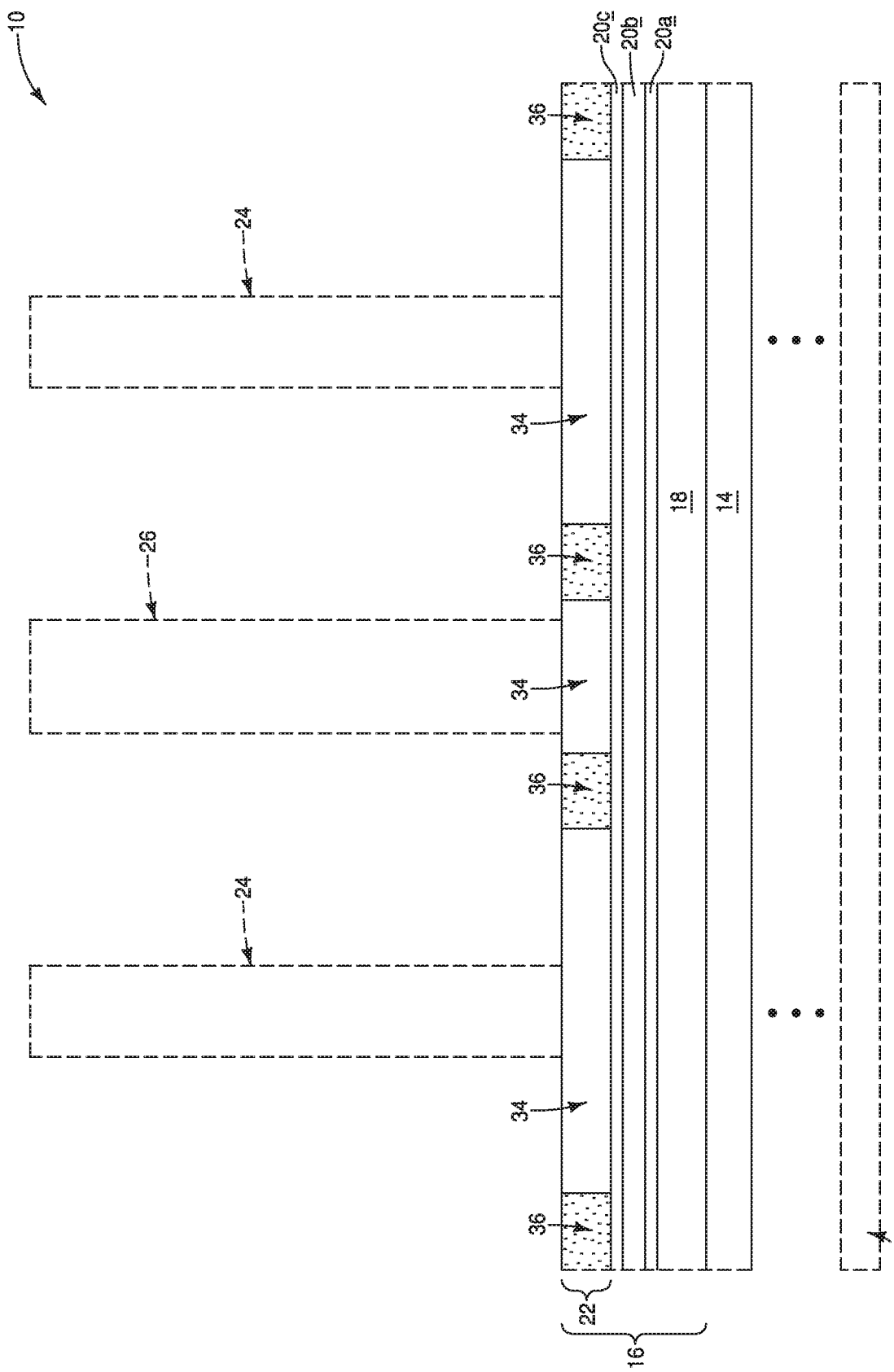

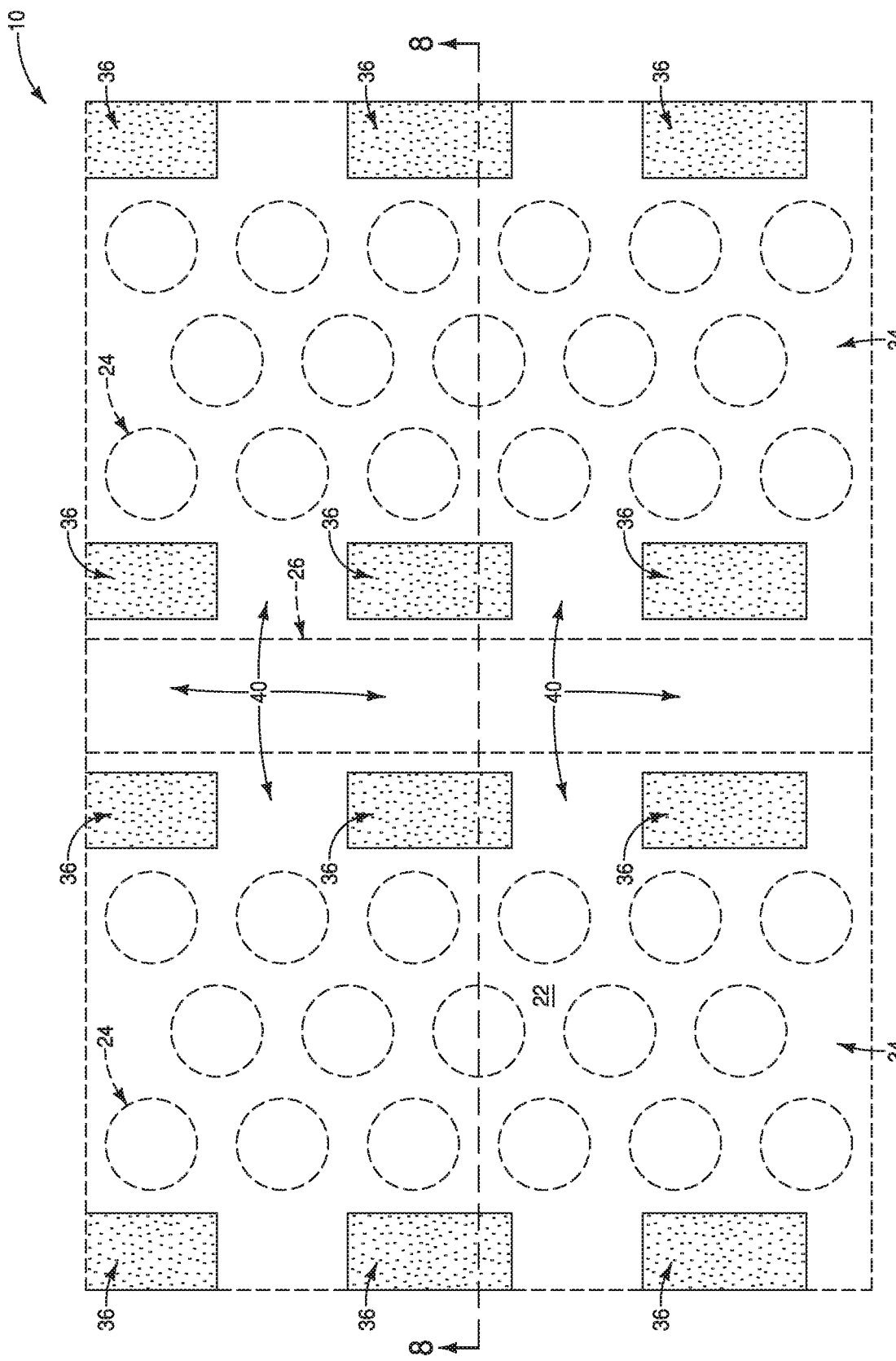

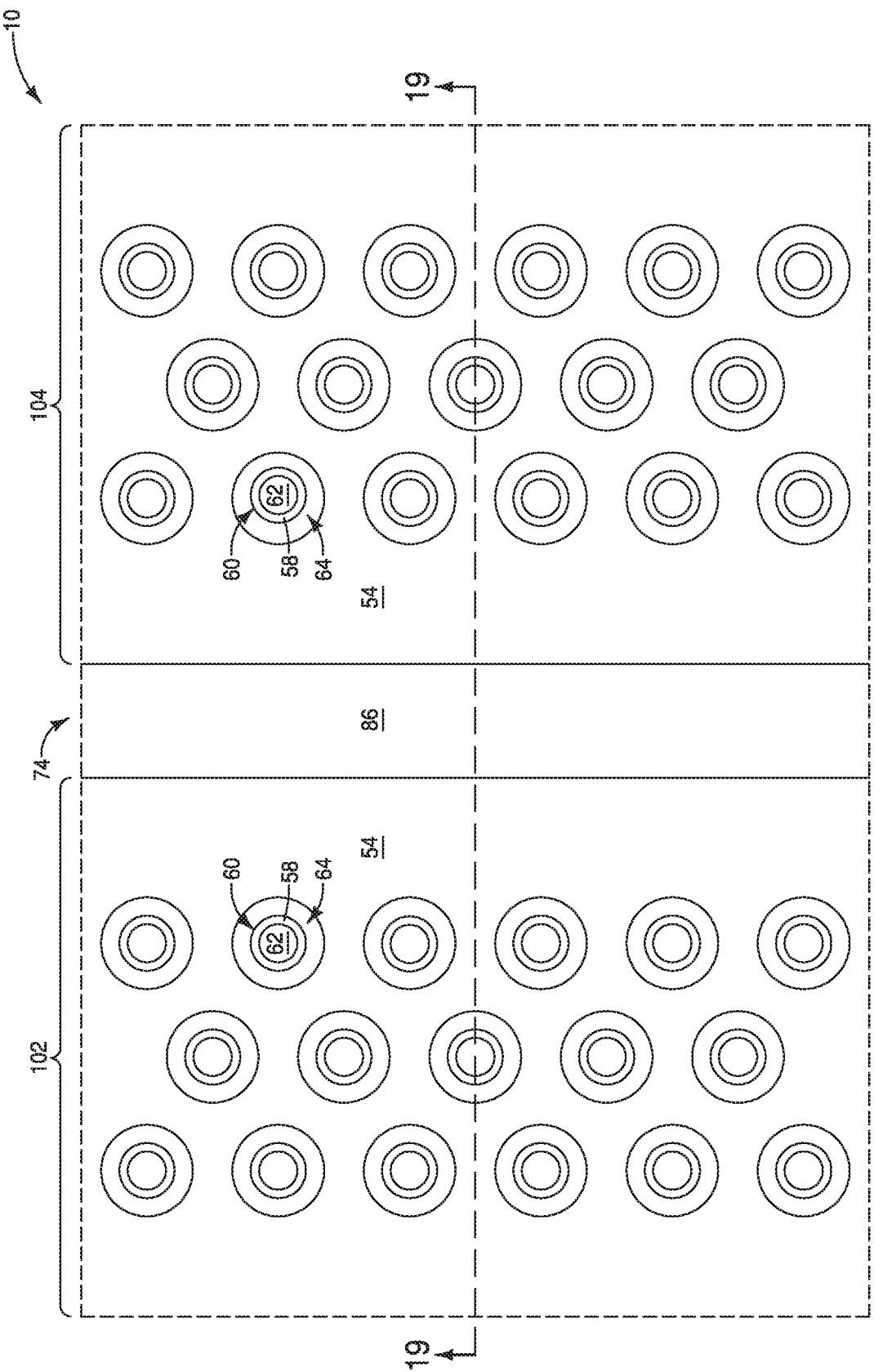

INTEGRATED ASSEMBLIES, AND METHODS OF FORMING INTEGRATED ASSEMBLIES

TECHNICAL FIELD

Methods of forming integrated assemblies (e.g., integrated memory devices). Integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

The vertically-stacked memory cells of three-dimensional NAND architecture may be block-erased by generating hole carriers beneath them, and then utilizing an electric field to sweep the hole carriers upwardly along the memory cells.

Gating structures of transistors may be utilized to provide gate-induced drain leakage (GIDL) which generates the holes utilized for block-erase of the memory cells. The transistors may be the source-side select (SGS) devices described above. The channel material associated with a string of memory cells may be configured as a channel material pillar, and a region of such pillar may be gatedly coupled with an SGS device. The gatedly coupled portion of the channel material pillar is a portion that overlaps a gate of the SGS device.

It can be desired that at least some of the gatedly coupled portion of the channel material pillar be heavily doped. In some applications it can be desired that the gatedly coupled portion include both a heavily-doped lower region and a lightly-doped upper region; with both regions overlapping the gate of the SGS device. Specifically, overlap with the lightly-doped region provides a non-leaky "OFF" characteristic for the SGS device, and overlap with the heavily-doped region provides leaky GIDL characteristics for the SGS device. The terms "heavily-doped" and "lightly-doped" are utilized in relation to one another rather than relative to specific conventional meanings. Accordingly, a "heavily-doped" region is more heavily doped than an adjacent "lightly-doped" region, and may or may not comprise heavy doping in a conventional sense. Similarly, the "lightly-doped" region is less heavily doped than the adjacent "heavily-doped" region, and may or may not comprise light doping in a conventional sense. In some applications, the term "lightly-doped" refers to semiconductor material having less than or equal to about $10^{18}$ atoms/cm$^3$ of dopant, and the term "heavily-doped" refers to semiconductor material having greater than or equal to about $10^{22}$ atoms/cm$^3$ of dopant.

The channel material may be initially doped to the lightly-doped level, and then the heavily-doped region may be formed by out-diffusion from an underlying doped semiconductor material.

It is desired to develop improved methods of forming integrated memory (e.g., NAND memory). It is also desired to develop improved memory devices.

BRIEF DESCRIPTION OF THE DRAWINGS

FIG. 4 is a schematic diagram of a prior art NAND memory array.

FIGS. 5 and 5A are a diagrammatic cross-sectional side view (FIG. 5) and a diagrammatic top-down view (FIG. 5A) of an example integrated assembly at an example process stage of an example embodiment method for forming an example memory device. The cross-sectional side view of FIG. 5 is along the line 5-5 of FIG. 5A.

FIGS. 6 and 6A are a diagrammatic cross-sectional side view (FIG. 6) and a diagrammatic top-down view (FIG. 6A) of the example integrated assembly of FIGS. 5 and 5A at an example process stage following that of FIGS. 5 and 5A. The cross-sectional side view of FIG. 6 is along the line 6-6 of FIG. 6A.

FIGS. 8 and 8A are a diagrammatic cross-sectional side view (FIG. 8) and a diagrammatic top-down view (FIG. 8A) of the example integrated assembly of FIGS. 5 and 5A at an example process stage following that of FIG. 7. The cross-sectional side view of FIG. 8 is along the line 8-8 of FIG. 8A.

FIG. 19 may be considered to illustrate an example memory device.

FIG. 19A is a diagrammatic top-down view along a tier of FIG. 19. The cross-sectional side view of FIG. 19 is along the line 19-19 of FIG. 19A.

DETAILED DESCRIPTION OF THE ILLUSTRATED EMBODIMENTS

Figure 1:
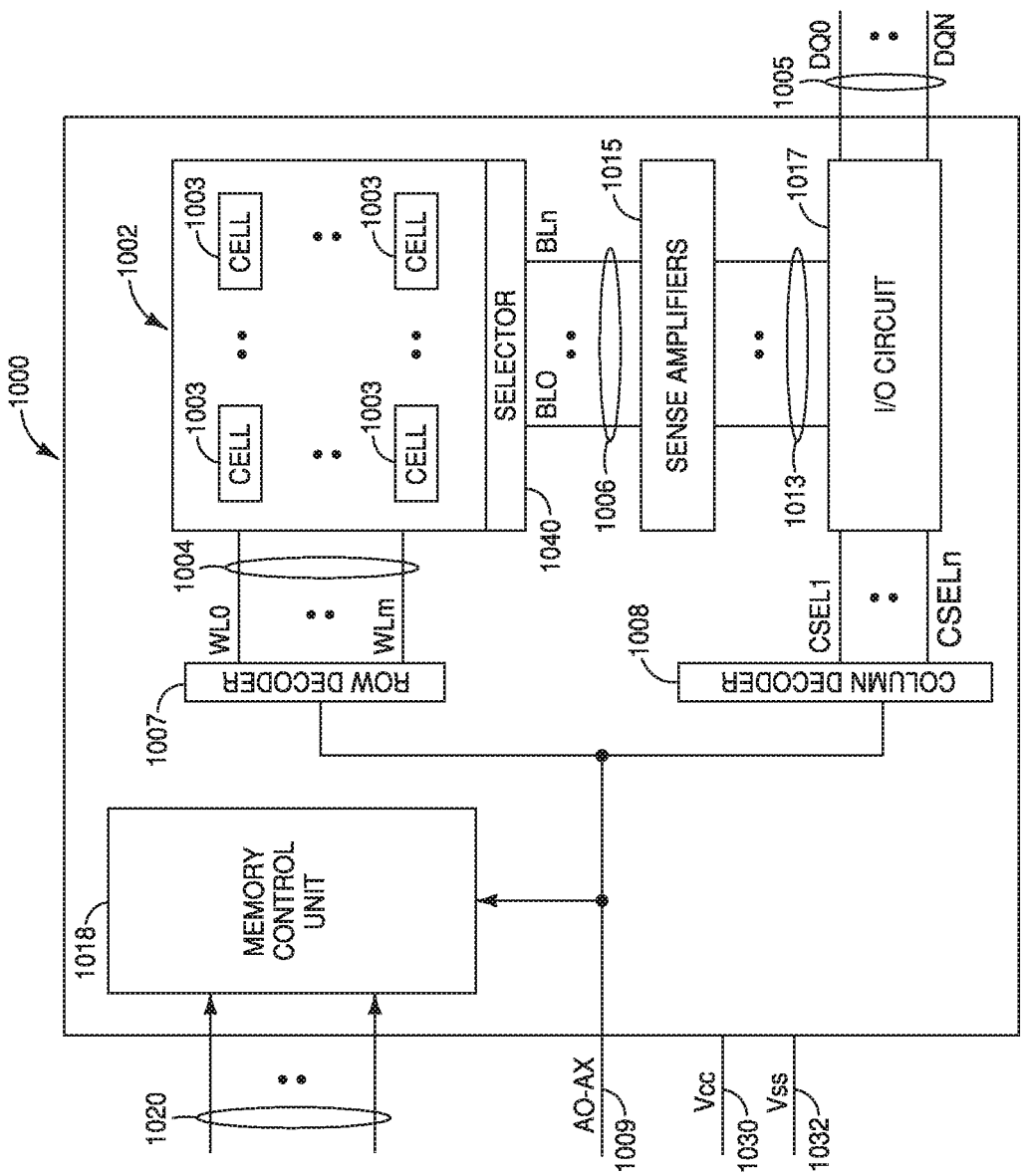
FIG. 1 shows a block diagram of a prior art memory device having a memory array with memory cells.
Figure 2:
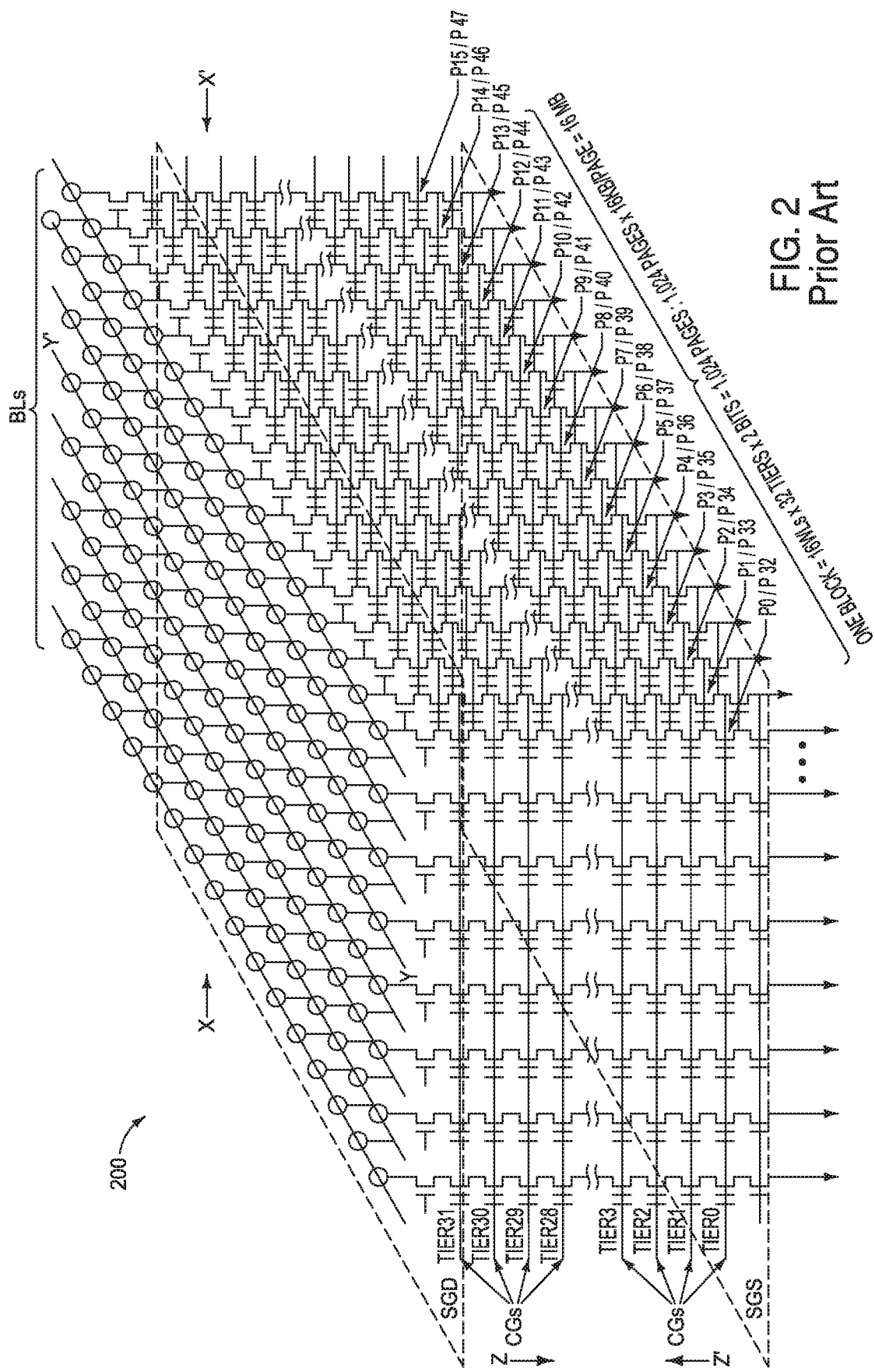
FIG. 2 shows a schematic diagram of the prior art memory device of FIG. 1 in the form of a 3D NAND memory device.
Figure 3:
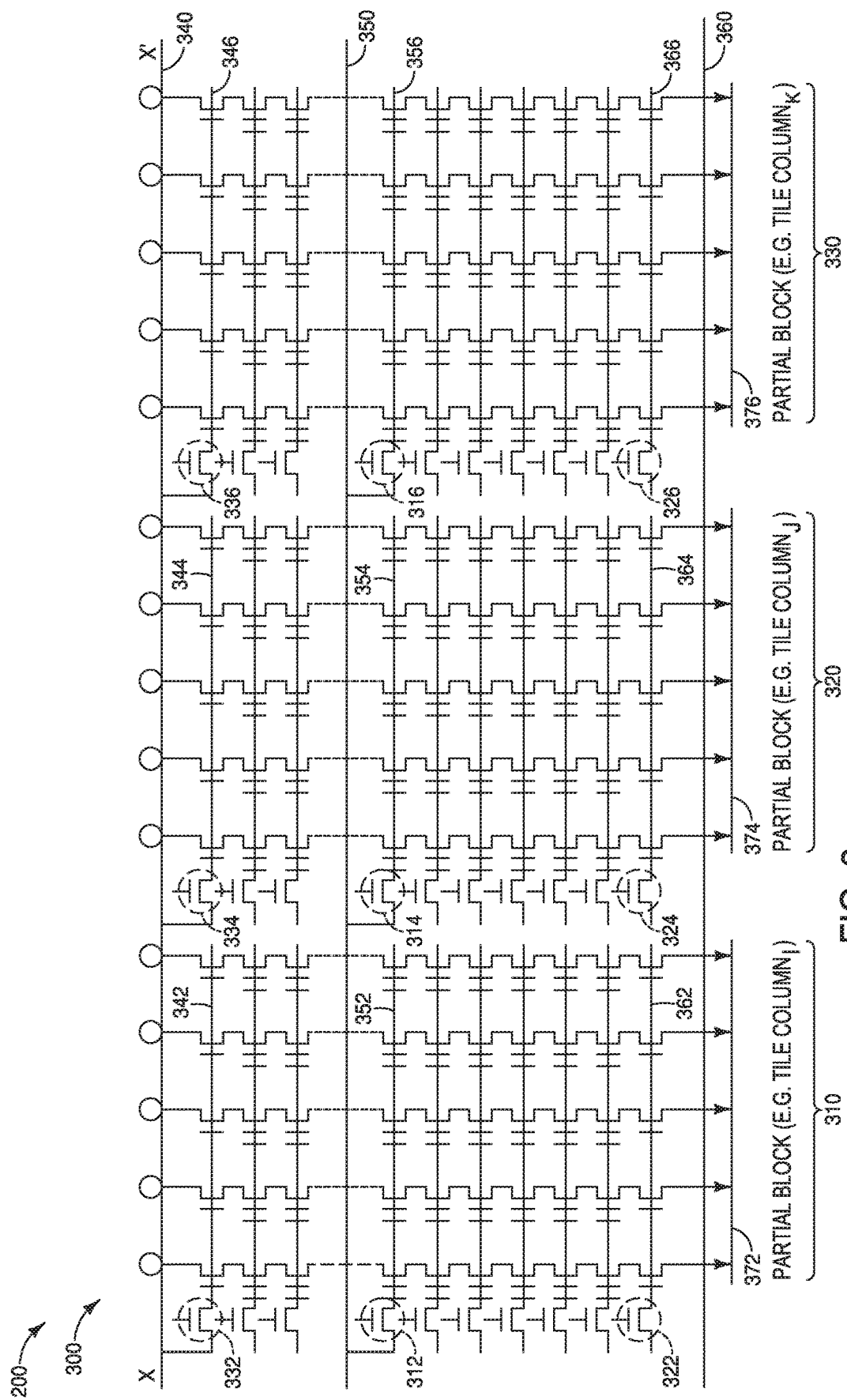
FIG. 3 shows a cross-sectional view of the prior art 3D NAND memory device of FIG. 2 in an X-X' direction.

Some embodiments include new methods of forming memory devices. The memory devices may have vertically-stacked memory cell levels over a conductive source structure. A sacrificial material may be provided in a region of the conductive source structure, and support blocks may be provided within the sacrificial material. The sacrificial material may be removed to leave voids, and the support blocks may remain to provide support to structures over the voids. Conductively-doped semiconductor material may then be formed within the voids. Some embodiments include integrated assemblies having support blocks extending through conductively-doped semiconductor material of a conductive source structure. Example embodiments are described with reference to FIGS. 5-20.

Referring to FIG. 5, an integrated assembly 10 includes an insulative material 14 over a base 12.

The base 12 may comprise semiconductor material; and may, for example, comprise, consist essentially of, or consist of monocrystalline silicon (Si). The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 12 and the insulative material 14 to indicate that there may be other materials, devices, etc., between the base 12 and the insulative material 14.

The insulative material 14 may comprise any suitable composition(s); such as, for example, one or more of silicon dioxide, silicon nitride, aluminum oxide, etc.

A stack 16 is formed over the insulative material 14. The stack 16 comprises a first material 18, layers 20a-c over the first material, and a second material 22 over the layers.

The first material 18 is electrically conductive, and may comprise any suitable composition(s). In some embodiments, the first material 18 may comprise conductively-doped semiconductor material; and may, for example, comprise, consist essentially of, or consist of conductively-doped silicon. The silicon may be in any suitable crystalline form (e.g., one or more of monocrystalline, polycrystalline, amorphous, etc.). The conductively-doped silicon may comprise dopant to a concentration of at least about $10^{20}$ atoms/cm$^3$; with example dopant including one or more of phosphorus, arsenic, boron, etc.

The first material 18 may be formed to any suitable thickness, and in some embodiments may be formed to a thickness within a range of from about 100 nanometers (nm) to about 300 nm.

The layers 20a-c may comprise any suitable material(s). In some embodiments, the layers 20a-c may be electrically insulative. For instance, the outer layers 20a and 20c may comprise, consist essentially of, or consist of silicon nitride; and the central layer 20b may comprise, consist essentially of, or consist of silicon dioxide. The layers 20a-c may be formed to a total overall thickness within a range of from about 5 nm to about 20 nm.

The layers 20a-c are examples of layers that may be formed between the materials 18 and 22. Regions of the second material 22 are removed during subsequent process stages, and the layers 20a-c may provide an interface over the material 18 so that the material 22 may be removed without detrimentally etching into the material 18. In some embodiments there may be fewer than the illustrated three layers 20a-c, and in some embodiments the may be more than the illustrated three layers. In some embodiments, the layers 20a-c may be omitted if the materials 22 and 18 comprise suitable compositions so that the material 22 may be removed without detriment to the material 18.

The second material 22 may comprise any suitable composition(s), such as, for example, one or more semiconductor materials. In some embodiments, the second material 22 may comprise, consist essentially of, or consist of silicon. The silicon within the second material 22 may comprise little or no dopant therein so that such silicon is not conductively doped. For instance, a dopant concentration within the second material 22 may be less than or equal to about $10^{16}$ atoms/cm$^3$.

Channel-material-pillars will eventually be supported by regions of the stack 16, and a slit will be provided between the channel-material-pillars to divide the pillars between a first set associated with a first memory block and a second set associated with a second memory block. Example locations for the channel-material-pillars are diagrammatically illustrated at the regions (areas) 24, and an example location for the slit is diagrammatically illustrated at the region (area) 26.

Figure 5A:
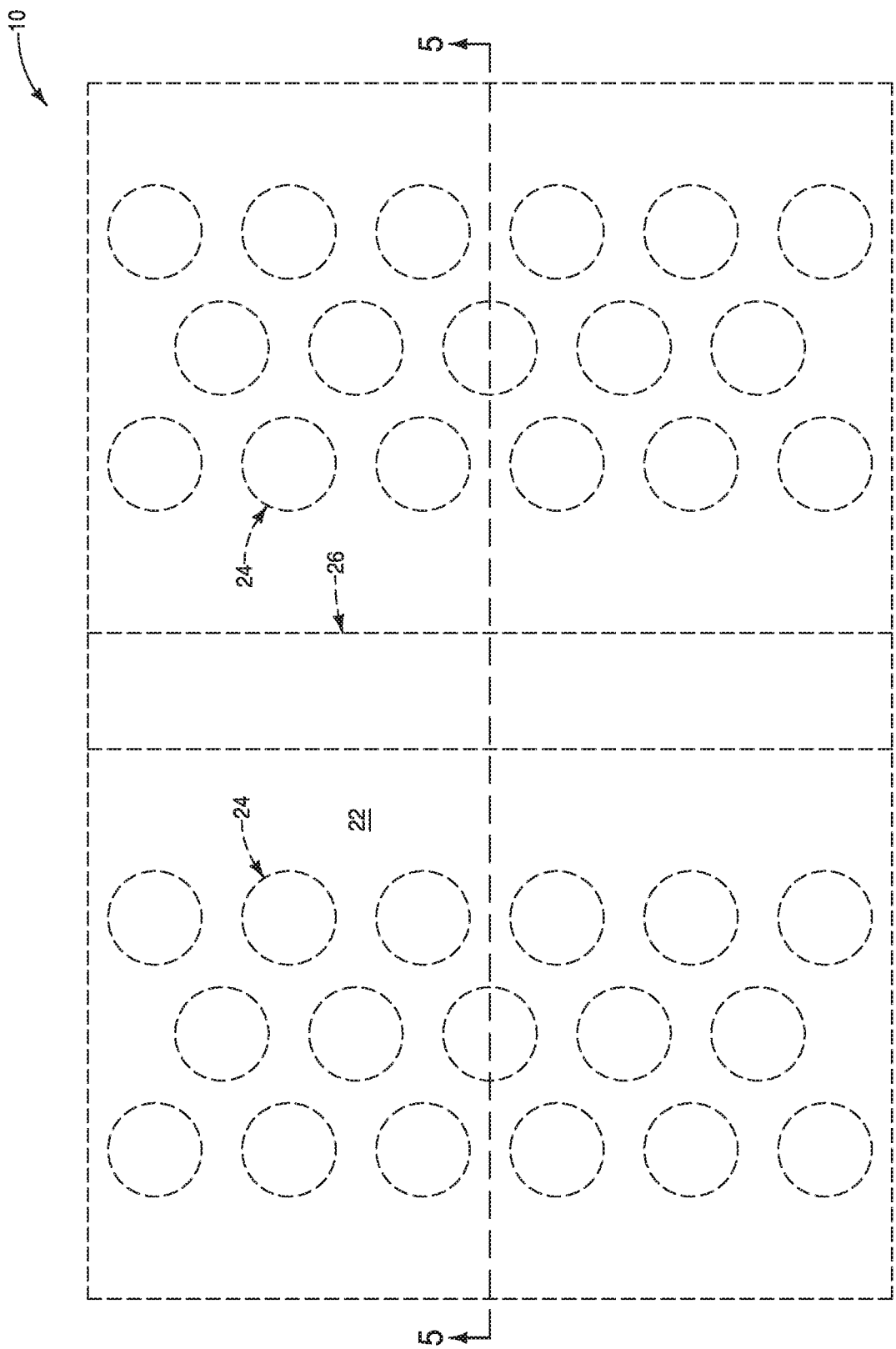

FIG. 5A shows a top view of the assembly 10 of FIG. 5, and shows an example arrangement for the channel-material-pillar-locations 24 and the slit-location 26.

Figure 6:
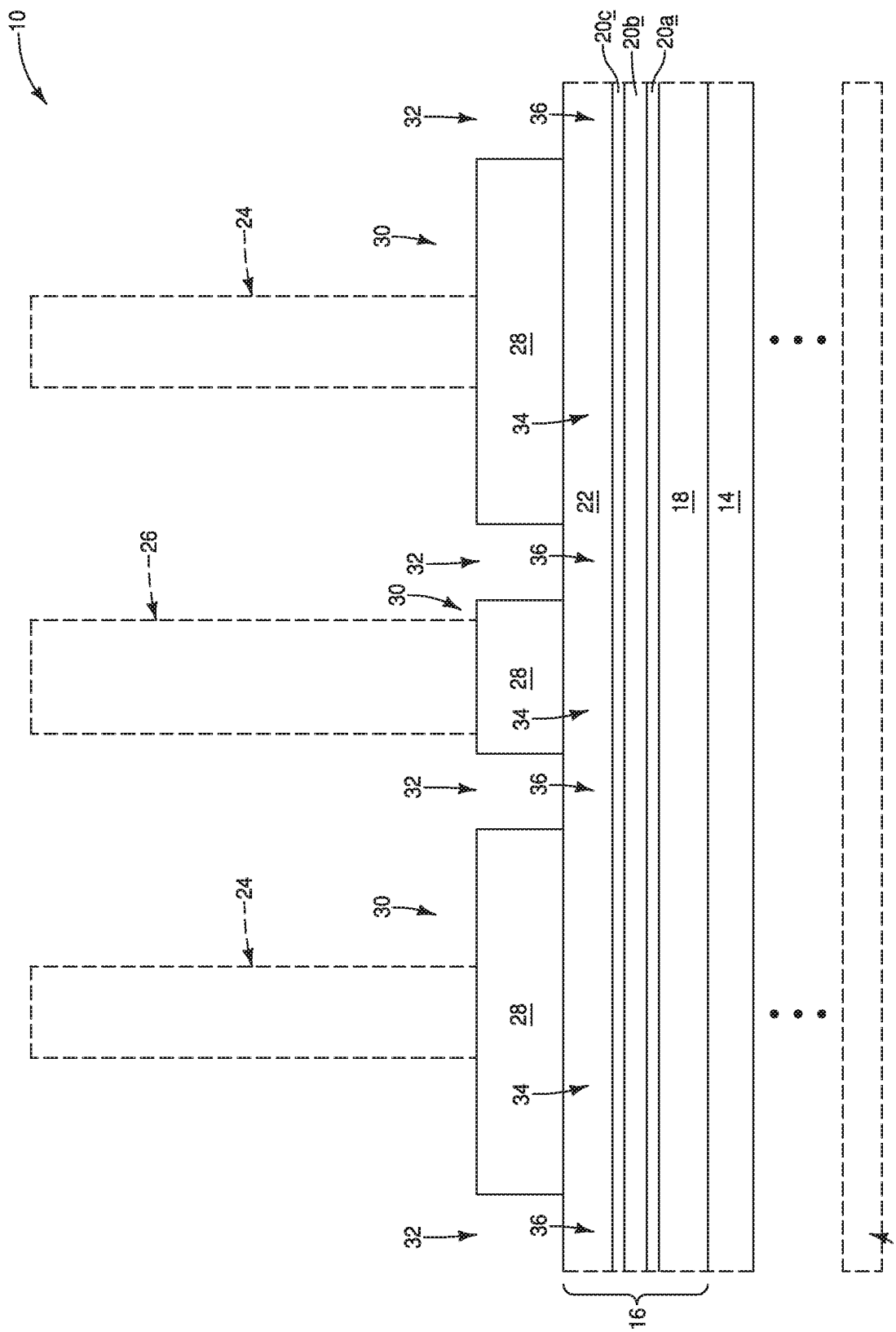

Referring to FIG. 6, masking material 28 is patterned into blocking regions 30 over the second material 22. The masking material 28 may comprise any suitable composition(s); and in some embodiments may comprise photolithographically-patterned photoresist. The blocking regions 30 are under the channel-material-pillar-locations 24 and the slit-location 26.

Openings 32 extend through the masking material 28. In some embodiments, the blocking regions 30 may be considered to block first regions 34 of the material 22, while leaving second regions 36 of the material 22 exposed by the openings 32.

FIG. 6A shows a top view of the assembly 10 of FIG. 6, and shows an example arrangement for the blocking regions 30 and the openings 32.

Figure 7:
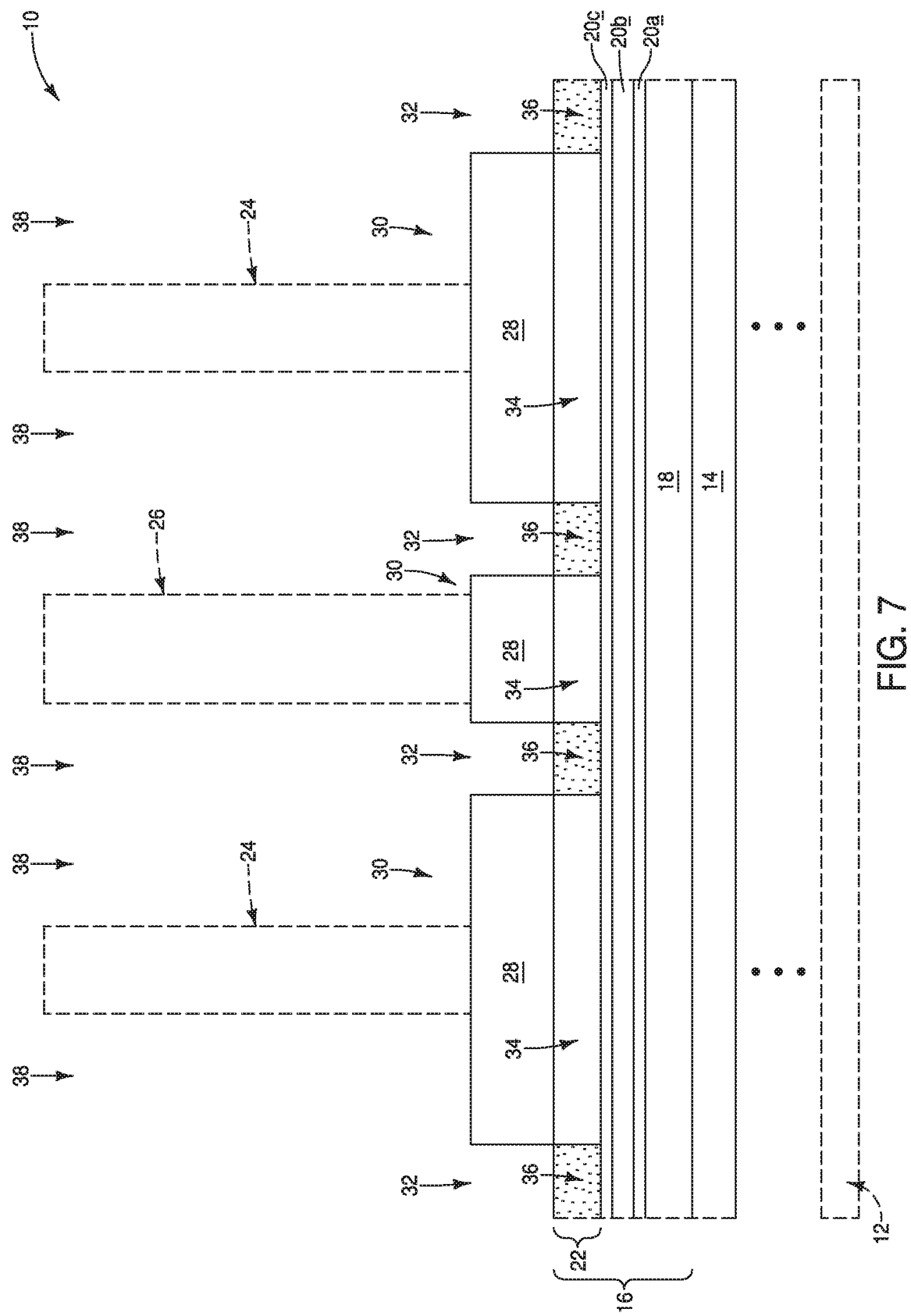
FIG. 7 is a diagrammatic cross-sectional side view of the example integrated assembly of FIG. 5 at an example process stage following that of FIG. 6.

Referring to FIG. 7, dopant 38 is implanted into the second regions 36 of the material 22 while the masking material 28 blocks the dopant from entering the first regions 34 of the material 22. The dopant within the regions 36 is diagrammatically illustrated with stippling.

The dopant 38 may comprise one or more elements selected from Groups 13-15 of the period table, and may be provided within the regions 36 to a total concentration within a range of from about $1\times10^{18}$ atoms/cm$^3$ to about $1\times10^{21}$ atoms/cm$^3$. In some embodiments, the dopant 38 may comprise, consist essentially of, or consist of carbon; and may be provided into the regions 36 to a concentration within a range of from about $1\times10^{18}$ atoms/cm$^3$ to about $1\times10^{21}$ atoms/cm$^3$. In some embodiments, the dopant 38 may comprise, consist essentially of, or consist of boron; and may be provided into the regions 36 to a concentration within a range of from about $1\times10^{18}$ atoms/cm$^3$ to about $1\times10^{21}$ atoms/cm$^3$.

In some embodiments, the undoped regions 34 of material 22 may correspond to sacrificial material which is selectively removable relative to the layer 20c and the doped regions 36. For purposes of interpreting this disclosure and the claims follow, a material is considered to be selectively removable relative to another material if the material may be etched faster than the other material.

The material 22 may comprise silicon in some embodiments. In such embodiments the doped regions 36 may be resistant to etching with tetramethylammonium hydroxide (TMAH) while the undoped regions 34 remain vulnerable to such etching. The assembly 10 may be subjected thermal processing and/or other conditions suitable for activation of dopant within the doped regions 36 if such activation improves resistance of the doped regions 36 to TMAH-containing etchant.

After the doping of the regions 36, the masking material 28 is removed to leave the assembly of FIG. 8. FIG. 8A shows a top view of the assembly 10 at the process stage of FIG. 8, and shows that undoped regions 34 of material 22 extend laterally around the doped regions 36 of the material 22. The undoped regions 34 may be considered to form bridging regions 40 (only some of which are labeled) extending between the doped regions 36.

Figure 9:
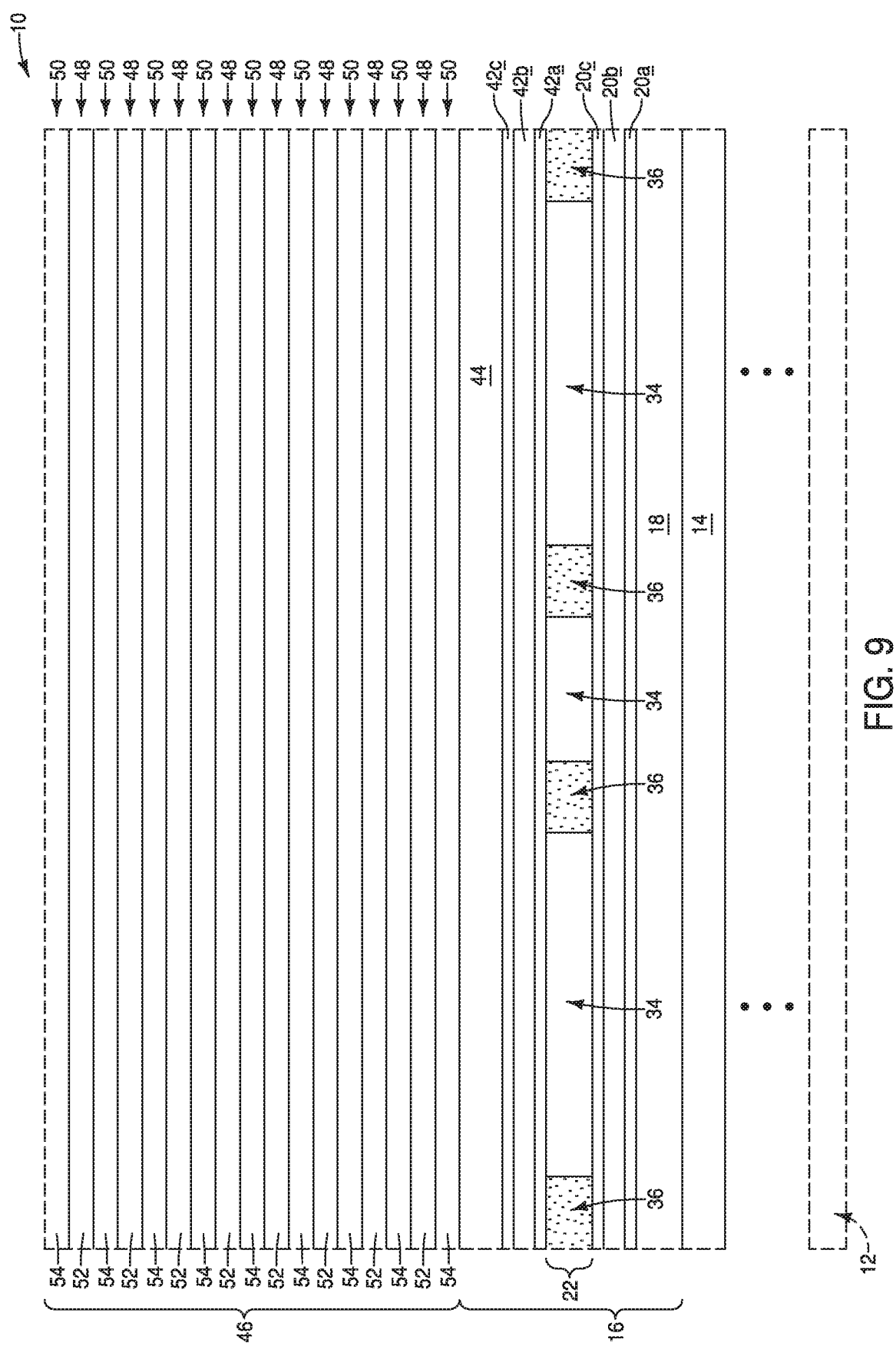
FIGS. 9-11 are diagrammatic cross-sectional side views of the example integrated assembly of FIG. 5 at example sequential process stages following that of FIG. 8.

Referring to FIG. 9, second layers 42a-c are formed over the second material 22, and a third material 44 is formed over the layers 42a-c.

The third material 44 is electrically conductive, and may comprise any suitable composition(s). In some embodiments, the third material 44 may comprise conductively-doped semiconductor material; and may, for example, comprise, consist essentially of, or consist of conductively-doped silicon. The silicon may be in any suitable crystalline form (e.g., one or more of monocrystalline, polycrystalline, amorphous, etc.). The third material be formed to any suitable thickness, and in some embodiments may be formed to a thickness within a range of from about 100 nm to about 300 nm. The conductively-doped silicon may comprise dopant to a concentration of at least about $10^{20}$ atoms/cm$^3$; with example dopant including one or more of phosphorus, arsenic, boron, etc. The third material 44 may or may not comprise the same composition as the first material 18.

The layers 42a-c may comprise any suitable material(s). In some embodiments the layers 42a-c may be electrically insulative. For instance, the outer layers 42a and 42c may comprise, consist essentially of, or consist of silicon nitride; and the central layer 42b may comprise, consist essentially of, or consist of silicon dioxide. The layers 42a-c may be formed to a total overall thickness within a range of from about 5 nm to about 20 nm.

The layers 42a-c are examples of layers that may be formed between the materials 44 and 22. Undoped regions 34 of the second material 22 are removed during a subsequent process stage, and the layers 42a-c may provide an interface so that such regions may be removed without detriment to the material 44. In some embodiments there may be fewer than the illustrated three layers 42a-c, and in some embodiments the may be more than the illustrated three layers. In some embodiments, the layers 42a-c may be omitted if the materials 22 and 44 comprise suitable compositions so that the undoped regions of the material 22 may be removed without detriment to the material 44.

The layers 42a-c may be referred to as second layers to distinguish them from the first layers 20a-c.

The layers 42a-c and the material 44 may be considered to be part of the stack 16.

A second stack 46 is formed over the first stack 16. The second stack 46 has alternating first and second levels 48 and 50. The first levels 48 comprise a material 52, and the second levels 50 comprise a material 54. The materials 52 and 54 may comprise any suitable compositions. In some embodiments, the material 52 may comprise, consist essentially of, or consist of silicon nitride; and the material 54 may comprise, consist essentially of, or consist of silicon dioxide.

Figure 10:
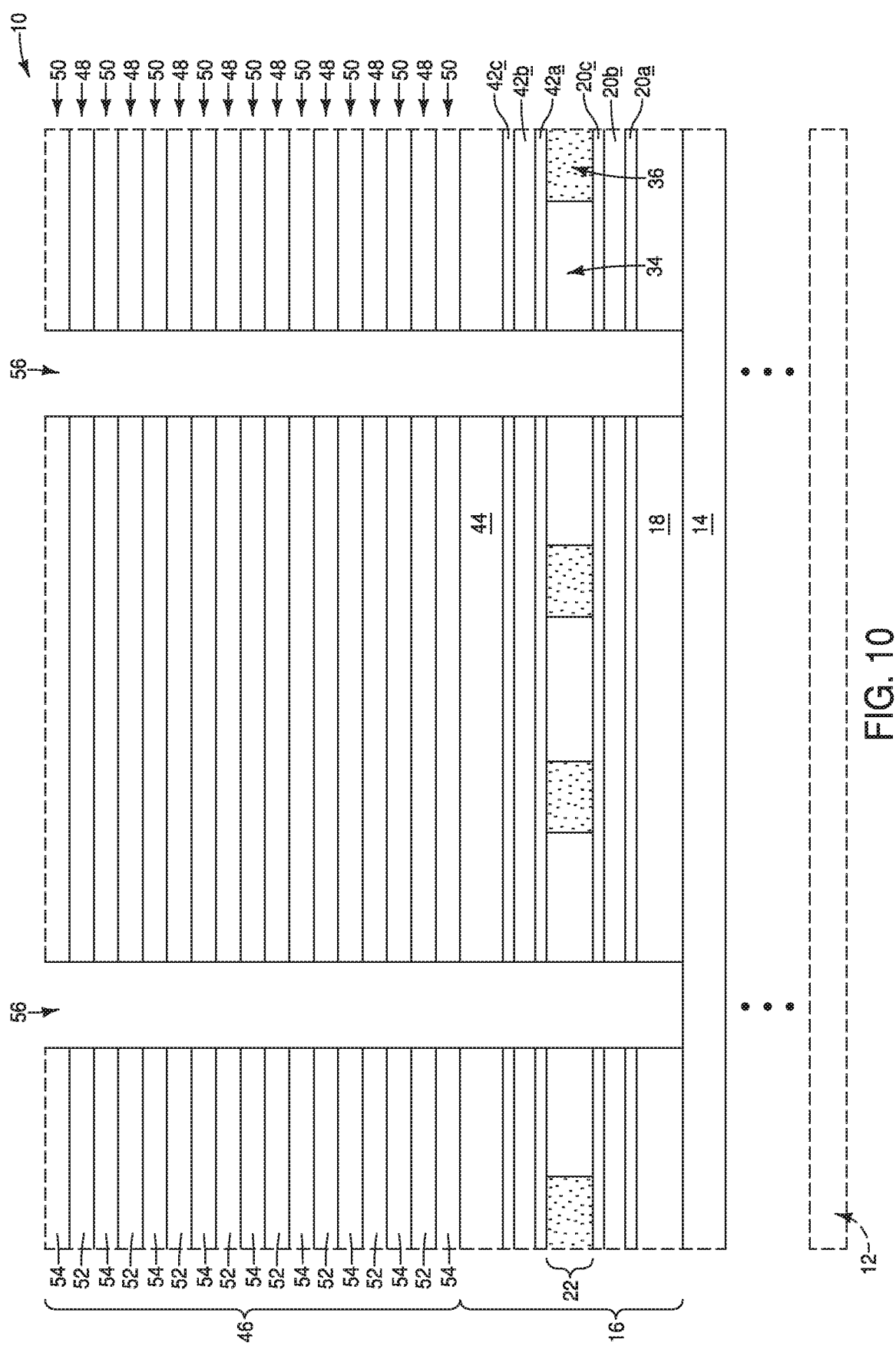

Referring to FIG. 10, openings 56 are formed to extend through the first and second stacks 16 and 46, with the openings 56 stopping on the insulative material 14 in the shown embodiment. The openings 56 are in the channel-material-pillar-locations 24 described above with reference to FIGS. 5 and 5A. The openings 56 may be referred to as first openings.

Figure 11:
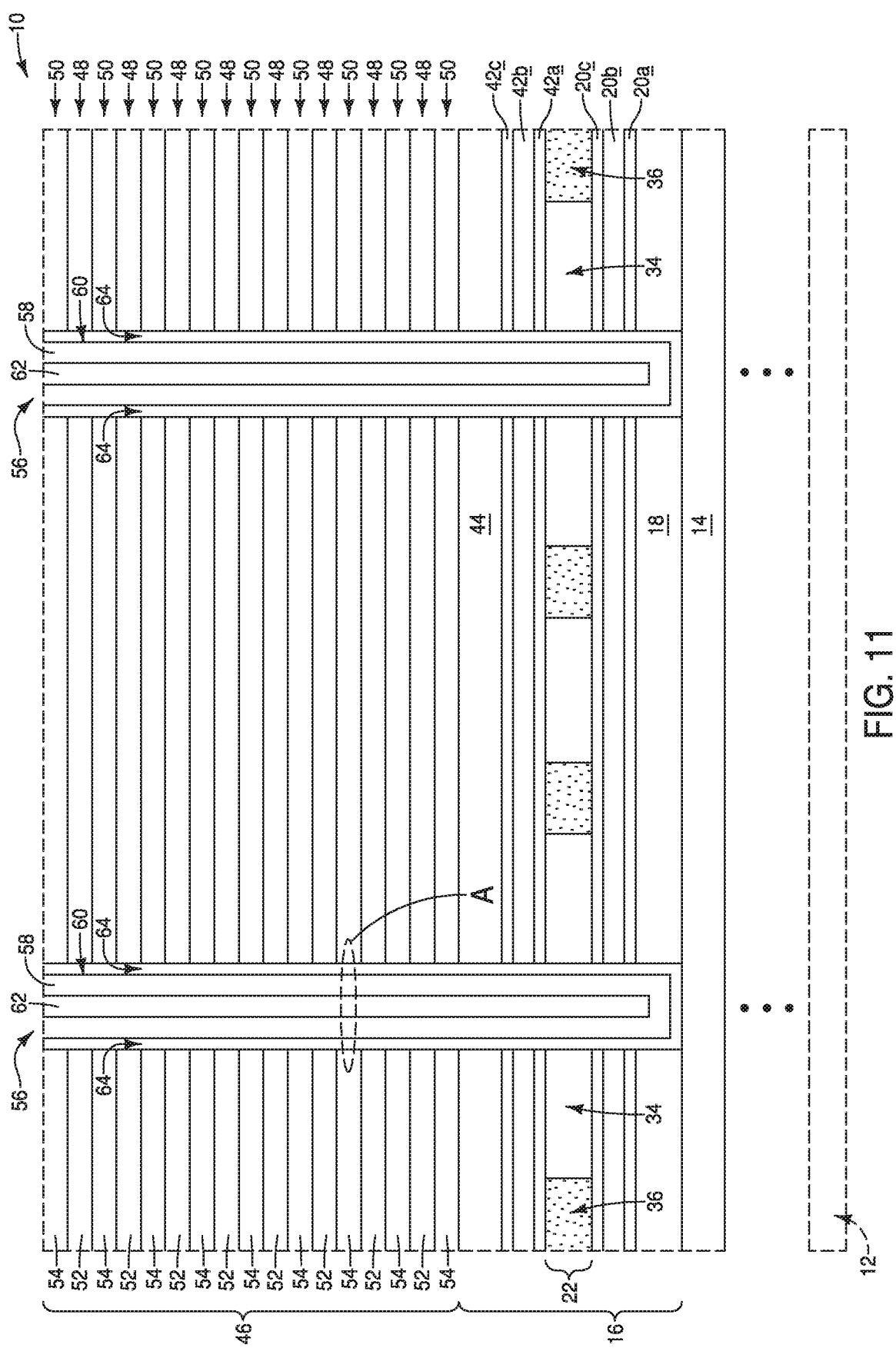

Referring to FIG. 11, semiconductor material (channel material) 58 is formed within the openings 56. The semiconductor material 58 is configured as channel-material-pillars 60.

The semiconductor material 58 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 58 may comprise, consist essentially of, or consist of appropriately-doped silicon.

In the illustrated embodiment, the channel-material-pillars 60 are annular rings (as shown in a top-down view of FIG. 19A), with such annular rings surrounding an insulative material 62. Such configuration of the channel-material-pillars may be considered to correspond to a "hollow" channel configuration, with the insulative material 60 being provided within the hollows of the channel-material-pillars. In other embodiments, the channel material 58 may be configured as solid pillars.

Figure 11A:
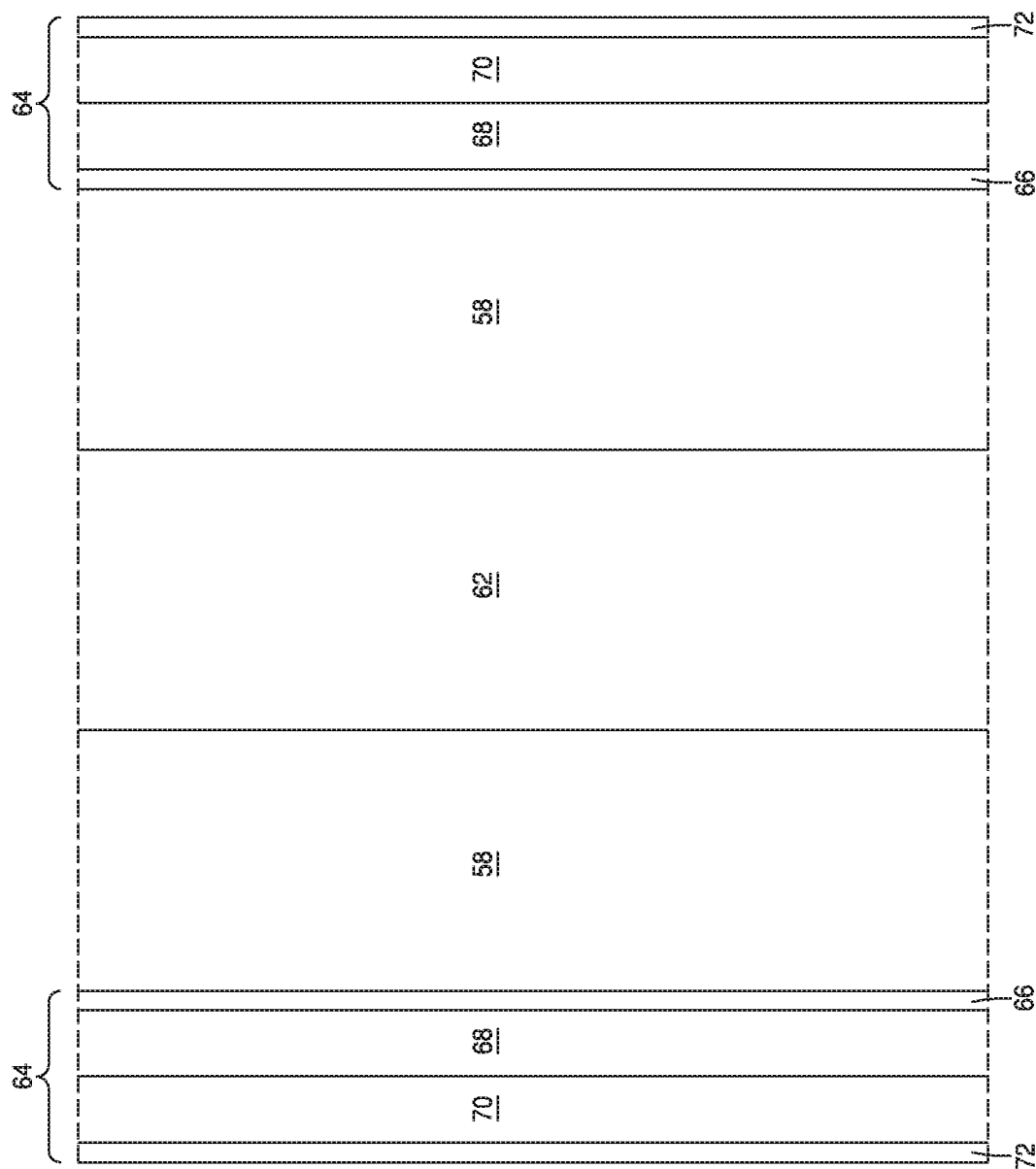
FIG. 11A is a diagrammatic cross-sectional side view of a region A of FIG. 11.

The channel-material pillars 60 are spaced from the materials 52 and 54 of the stack 46 by intervening regions 64. The regions 64 comprise one or more cell materials (memory cell materials), with such cell materials being formed within the openings 56 prior to the channel material 58. The cell materials of the regions 64 may comprise tunneling material 66, charge-storage material 68, charge-blocking material 70 and dielectric-barrier material 72; as shown in FIG. 11A.

The tunneling material 66 (also referred to as gate dielectric material) may comprise any suitable composition(s); and in some embodiments may comprise one or more of silicon dioxide, aluminum oxide, hafnium oxide, zirconium oxide, etc.

The charge-storage material 68 may comprise any suitable composition(s); and in some embodiments may comprise floating gate material (e.g., polysilicon) or charge-trapping material (e.g., one or more of silicon nitride, silicon oxynitride, conductive nanodots, etc.).

The charge-blocking material 70 may comprise any suitable composition(s); and in some embodiments may comprise one or more of silicon dioxide, aluminum oxide, hafnium oxide, zirconium oxide, etc.

The dielectric-barrier material 72 may comprise any suitable composition(s); and in some embodiments may comprise one or more of aluminum oxide, hafnium oxide, zirconium oxide, etc.

In some embodiments, the cell materials 66, 68, 70 and 72 may be considered to be formed within the openings 56 of FIG. 11 to line the openings, and then the channel material 58 may be formed within such lined openings. FIG. 11A shows that the channel material 58 is spaced from the charge-storage material 68 by the insulative material (tunneling material) 66.

Figure 12:
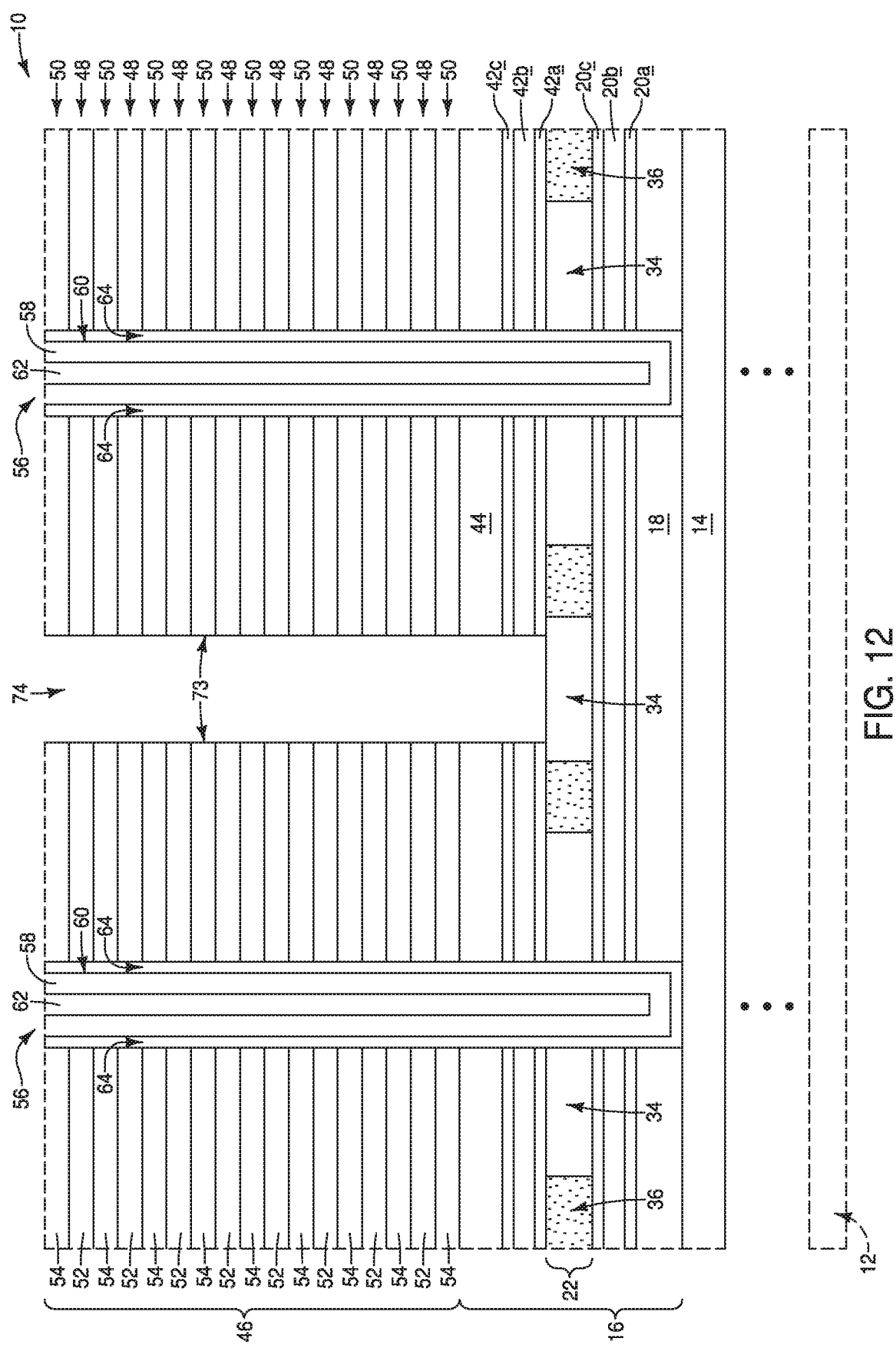
FIGS. 12-19 are diagrammatic cross-sectional side views of the example integrated assembly of FIG. 5 at example sequential process stages following that of FIG. 11.

Referring to FIG. 12, a second opening 74 is formed to pass through the second stack 46 and to one of the first regions 34 of the second material 22. The opening 74 may or may not penetrate into the second material 22.

In some embodiments, the openings 56 are cylindrical openings (as may be understood with reference to the top-down view of FIG. 19A), and the opening 74 is a trench (slit) which extends in and out of the page relative to the cross-section of FIG. 12 (as may also be understood with reference to the top-down view of FIG. 19A).

The opening 74 has sidewall surfaces 73 which extend along the materials 52 and 54 of the stack 46. In the shown embodiment the sidewall surfaces 73 are substantially vertically straight; with the term "substantially vertically straight" meaning vertically straight to within reasonable tolerances of fabrication and measurement. In other embodiments the sidewall surfaces 73 may be tapered.

Figure 13:
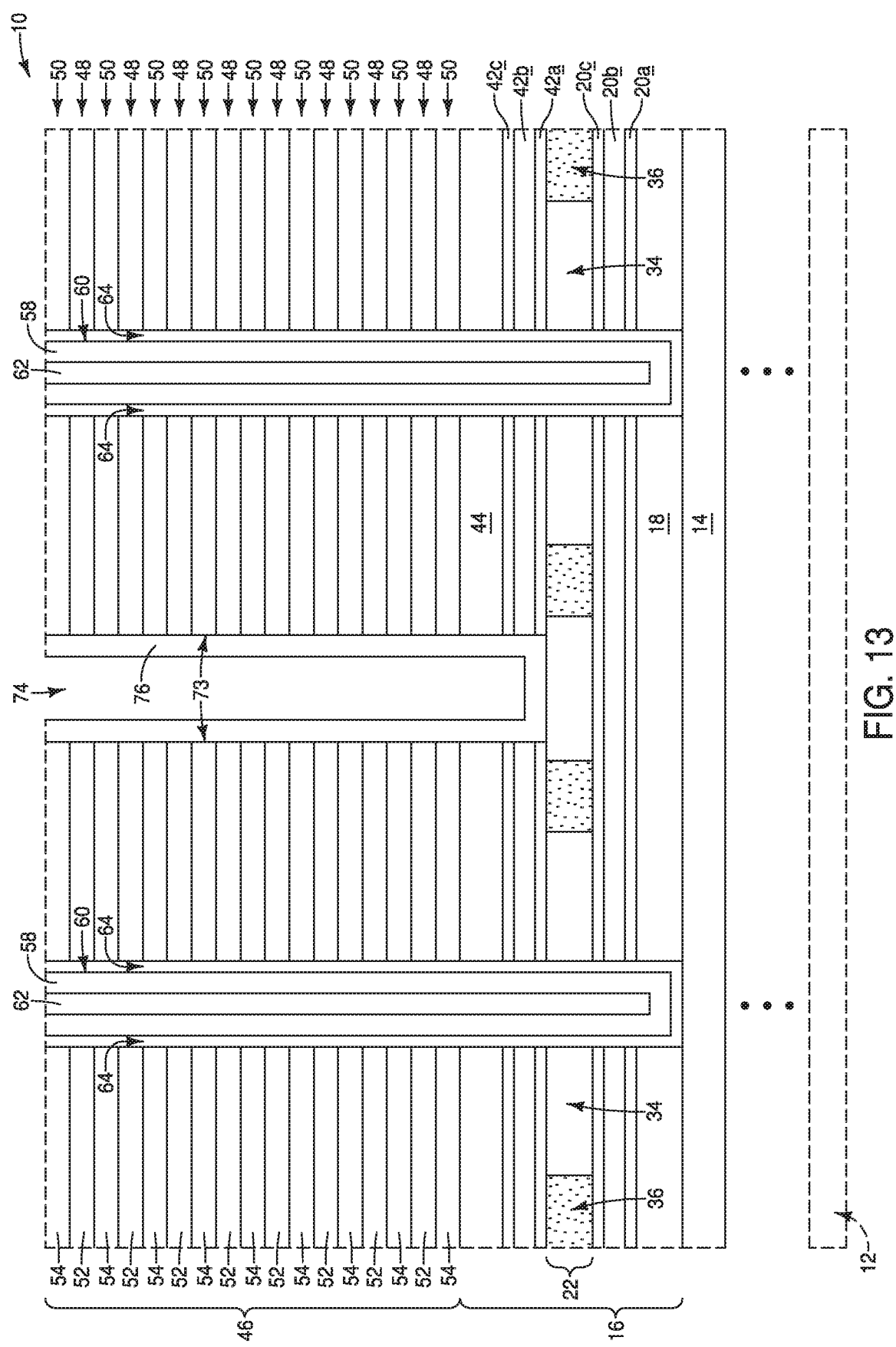

Referring to FIG. 13, protective material 76 is formed within the opening (slit) 74, and along the sidewall surfaces 73. In some embodiments the protective material 76 may be considered to line the sidewall surfaces 73.

The protective material 76 may comprise any suitable composition(s). In some embodiments, the protective material 76 may comprise, consist essentially of, or consist of silicon; and specifically may comprise silicon which is effectively undoped (e.g., comprising an intrinsic dopant concentration, and in some embodiments comprising a dopant concentration of less than or equal to about $10^{16}$ atoms/cm$^3$). In some embodiments, the protective material 76 may comprise one or more of metal (e.g., tungsten, titanium, etc.), metal-containing material (e.g., metal silicide, metal nitride, metal carbide, metal boride, etc.) and semiconductor material (e.g., silicon, germanium, etc.).

The protective material 76 may or may not extend across an upper surface of the assembly 10.

Figure 14:
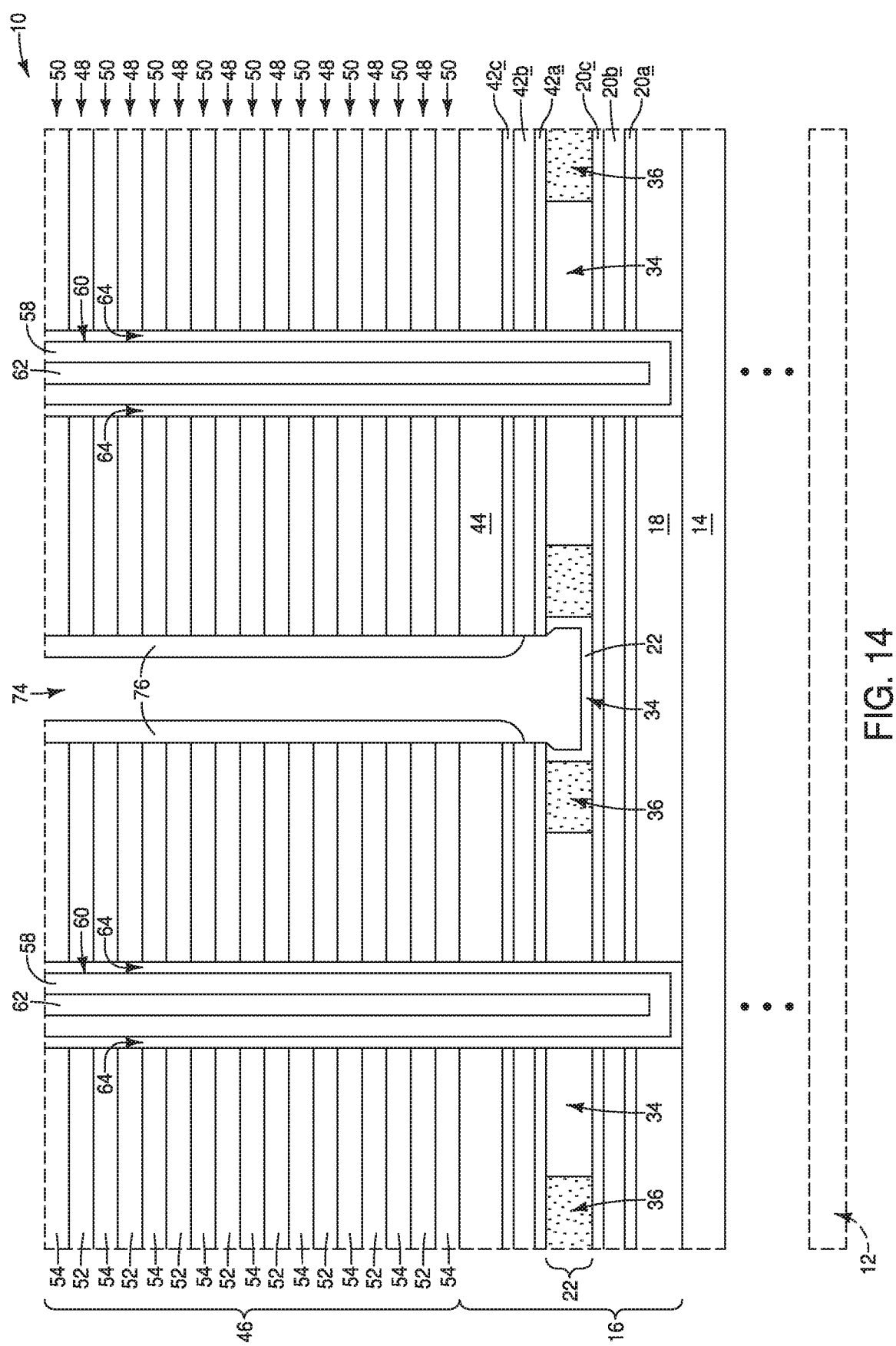

Referring to FIG. 14, one or more etches are utilized to punch through the protective material 76 at the bottom of the opening (slit) 74 to expose one or more of the undoped first regions 34 of the material 22. In the shown embodiment, the etching penetrates partially through the material 22. In other embodiments, the etching may stop at an upper surface of the material 22. In yet other embodiments, the etching may penetrate entirely through the material 22 to stop on a surface of the layer 20c.

Figure 15:
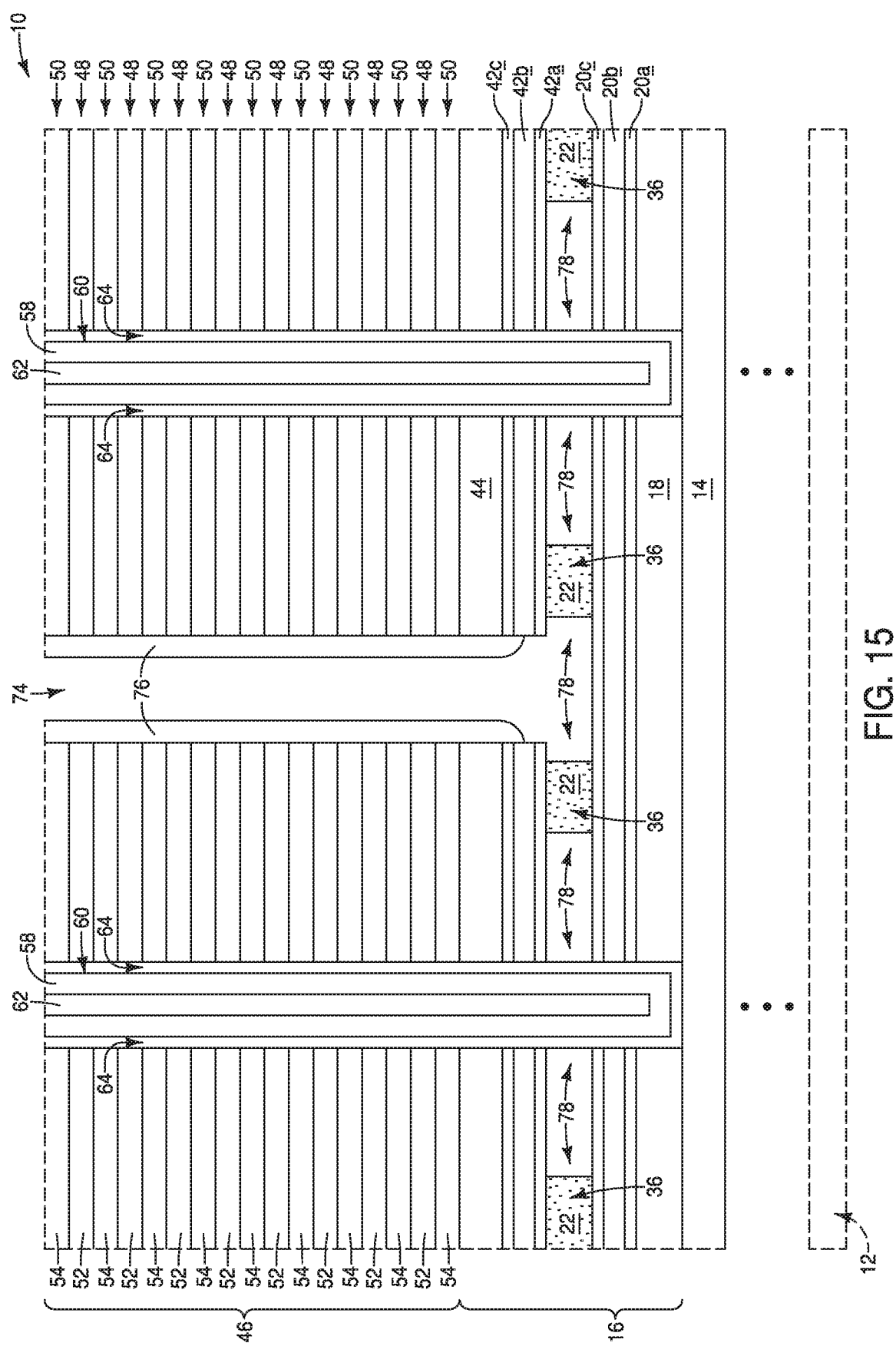

Referring to FIG. 15, the first regions 34 (FIG. 14) of the material 22 are selectively removed relative to the second regions 36 to form conduits 78 that pass around the second regions 36. The conduits 78 pass laterally around the second regions 36 within the bridging regions 40 described above with reference to FIG. 8A. The first regions 34 may be selectively removed relative to the second regions 36 with any suitable methodology. In some embodiments the regions 34 comprise undoped silicon (or at least substantially undoped silicon), and the regions 36 comprise doped silicon; and the regions 34 are selectively removed utilizing TMAH-comprising etchant. For purposes of interpreting this disclosure and the claims that follow, a first material is considered to be selectively removed relative to a second material if the first material is removed faster than the second material; which may include, but which is not limited to, conditions which are 100% selective for the first material relative to the second material.

The conduits 78 extend to the dielectric-barrier material 72 described above with reference to FIG. 11A. In some embodiments, the conduits 78 may be indicated to extend to the cell materials provided within the regions 64 (e.g., to extend to one or more of the cell materials 66, 68, 70 and 72 shown in FIG. 11A). In some embodiments the dielectric-barrier material 72 may be omitted from the materials formed within the regions 64, and the conduits 78 may instead extend to the charge-blocking material 70.

Figure 16:
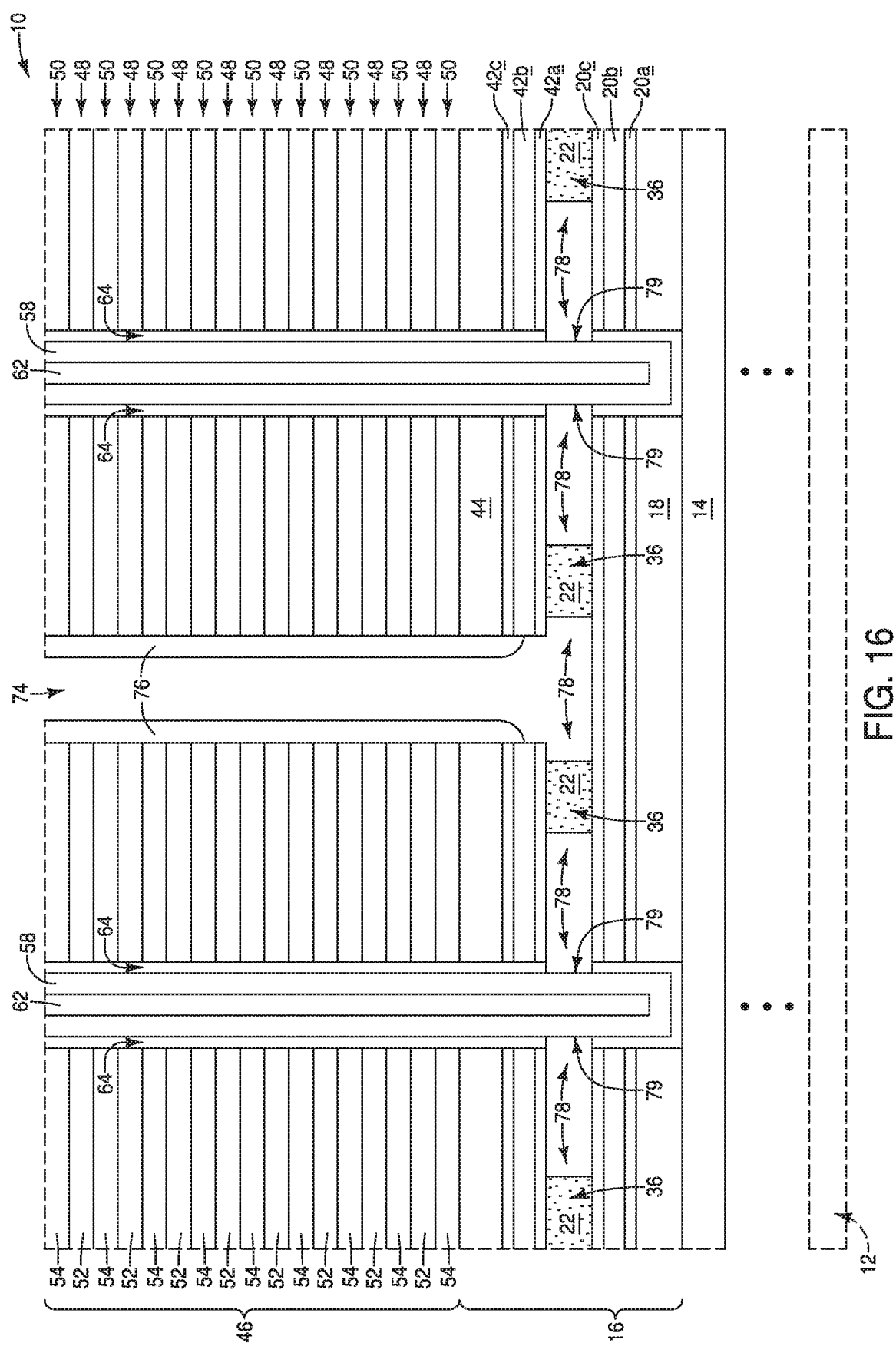

Referring to FIG. 16, the conduits 78 are extended through the cell materials within the regions 64 to expose sidewall surfaces 79 of the semiconductor material (channel material) 58.

Figure 17:
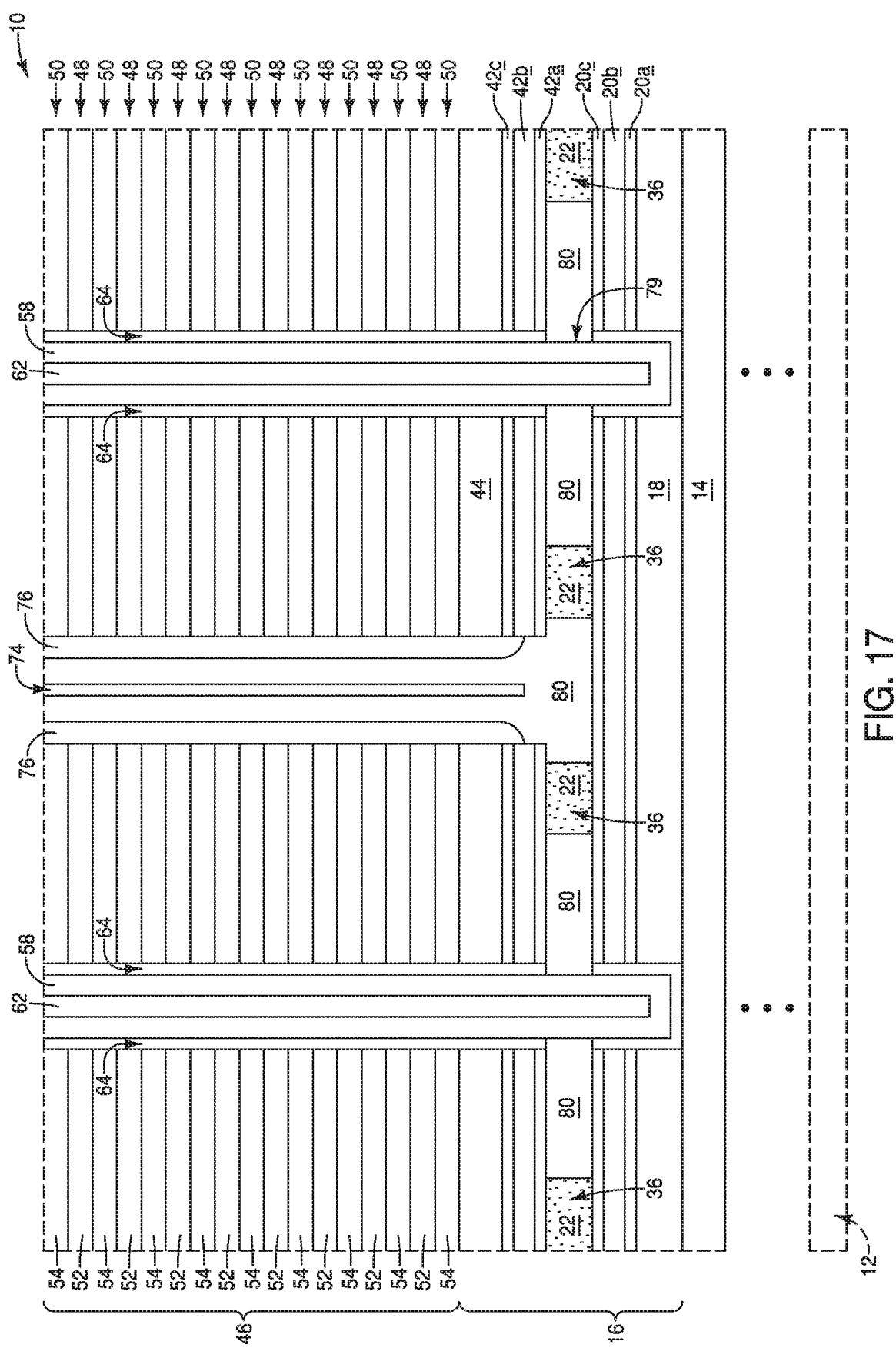

Referring to FIG. 17, conductively-doped semiconductor material 80 is formed within the conduits 78 (FIG. 16). The semiconductor material 80 may comprise any suitable composition(s); and in some embodiments may comprise, consist essentially of, or consist of one or more of silicon, germanium, III/V semiconductor material (e.g., gallium phosphide), semiconductor oxide, etc. In some embodiments, the semiconductor material 80 may comprise silicon which is heavily doped (e.g., doped to a concentration of at least about $10^{22}$ atoms/cm$^3$) with n-type dopant (e.g., phosphorus).

The doped semiconductor material 80 directly contacts the channel material 58 along the sidewalls 79.

Figure 18:
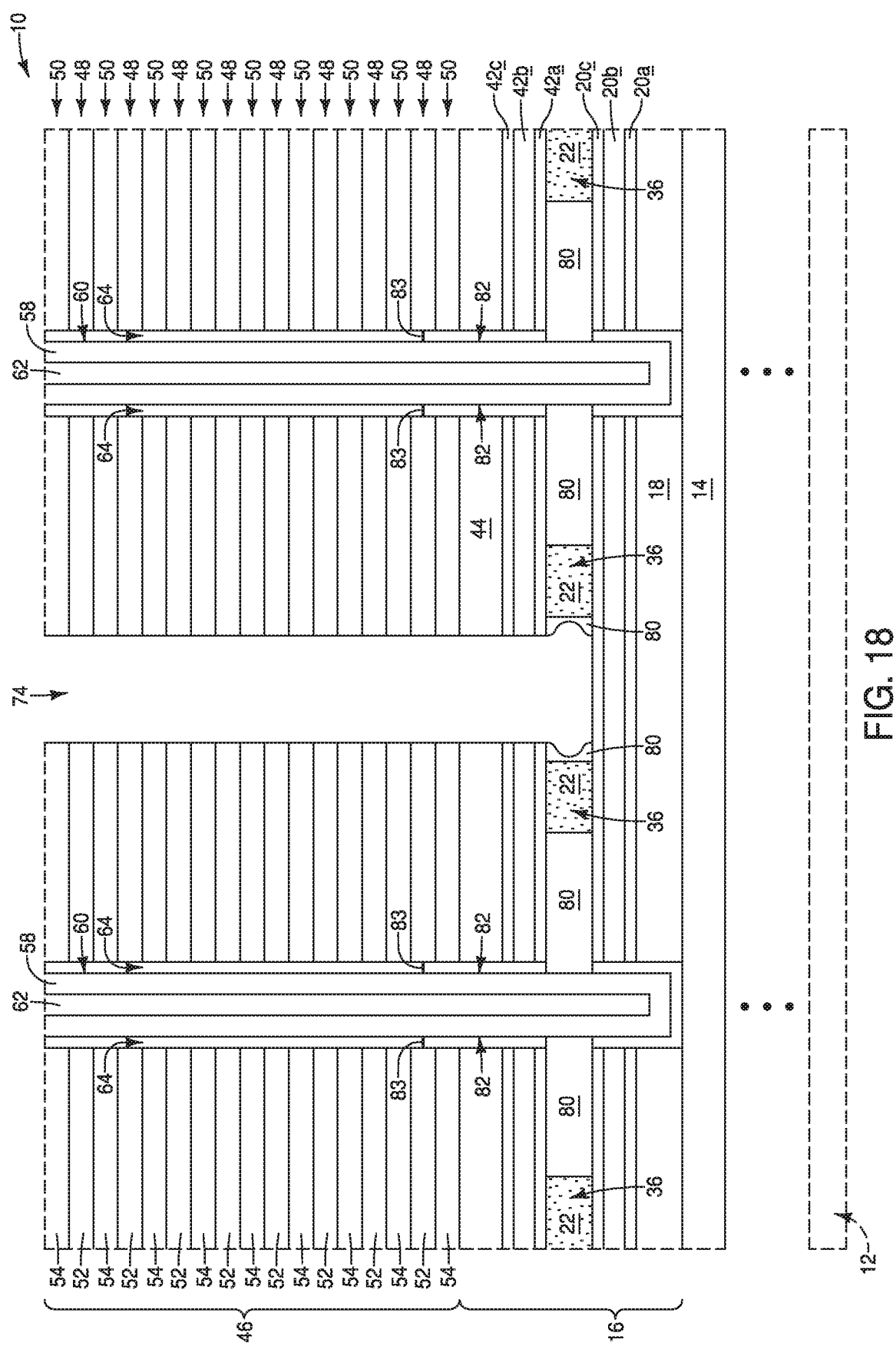

Referring to FIG. 18, the materials 76 and 80 are removed from within the opening (slit) 74. The materials 76 and 80 may be removed to any suitable level within the slit 74.

Dopant is out-diffused from the conductively-doped semiconductor material 80 into the semiconductor material (channel material) 58 to form heavily-doped regions 82 within lower portions of the channel-material-pillars 60. Lines 83 are utilized to indicate approximate upper boundaries of the dopant within the heavily-doped regions 82.

The out-diffusion from the doped material 80 into the semiconductor material 58 may be accomplished with any suitable processing, including, for example, suitable thermal processing (e.g., thermal processing at a temperature exceeding about 300° C. for a duration of at least about two minutes).

Figure 19:
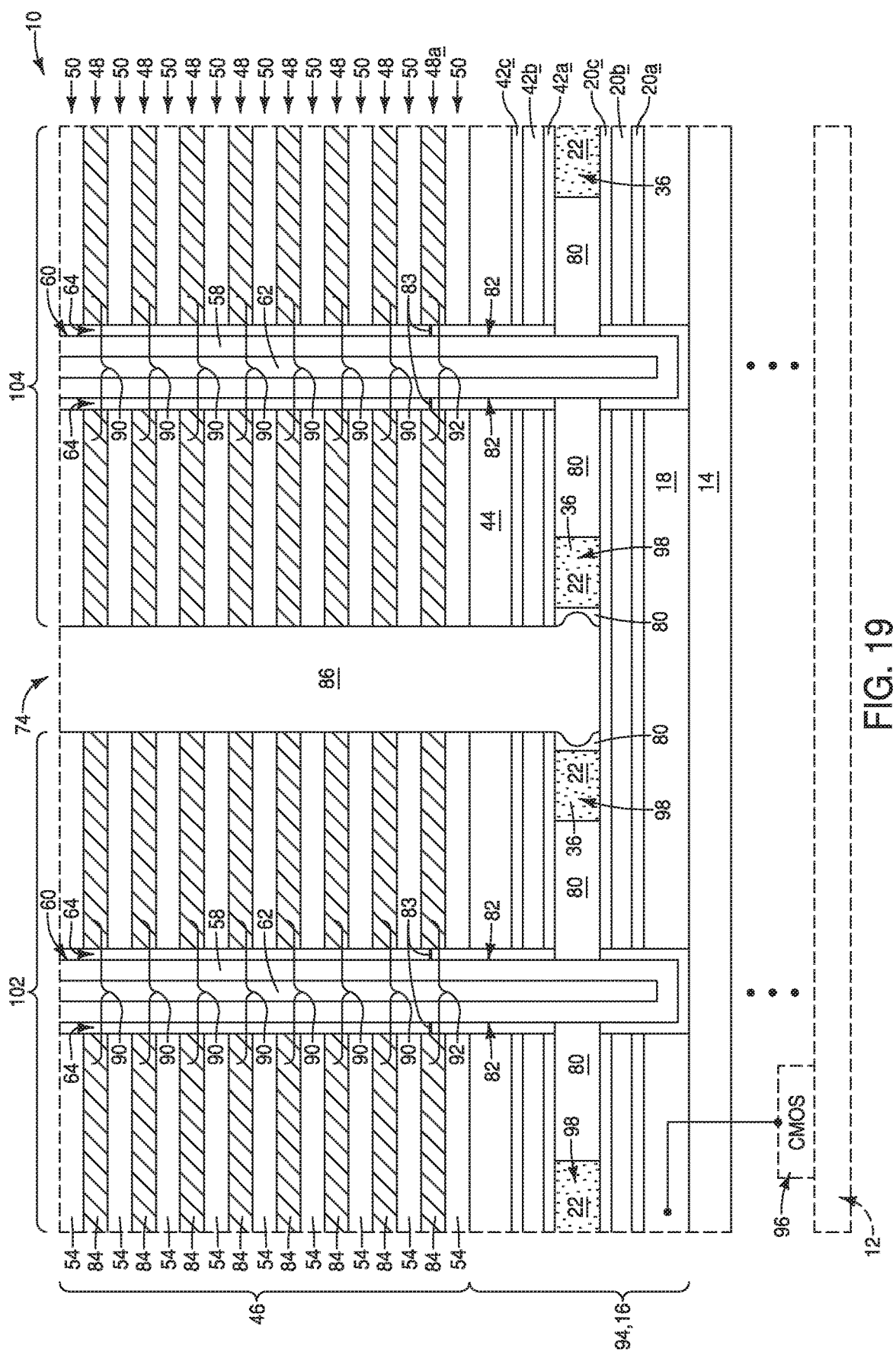

Referring to FIG. 19, the material 52 (FIG. 18) of the first levels 48 is removed and replaced with conductive material 84. Although the conductive material 84 is shown to entirely fill the first levels 48, in other embodiments at least some of the material provided within the first levels 48 may be insulative material (e.g., dielectric-blocking material). If the dielectric-blocking material is provided along the first levels 48, then the dielectric-barrier material 72 may be omitted from the cell materials described above with reference to FIG. 11A.

The conductive material 84 may comprise any suitable composition(s); and in some embodiments may comprise a tungsten core at least partially surrounded by titanium nitride.

The first levels 48 of FIG. 19 are conductive levels, and the stack 46 may be considered to comprise alternating insulative levels 50 and conductive levels 48.

After the conductive material 84 is formed along the levels 48, insulative material 86 is formed within the slit 74. The insulative material 86 may comprise any suitable composition(s); and in some embodiments may comprise, consist essentially of, or consist of silicon dioxide.

The assembly 10 of FIG. 19 is shown as a memory device comprising memory cells 90 and select devices (SGS devices) 92. A lowermost of the conductive levels 48 is labeled 48a, and the doped region 82 extends to the conductive level 48a. The conductive level 48a comprises the SGS devices 92. In the shown embodiment, the dopant extends partially across the level 48a to achieve the desired balance between non-leaky OFF characteristics and leaky GIDL characteristics for the SGS devices.

Although only one of the conductive levels is shown incorporated into the SGS devices, in other embodiments multiple conductive levels may be incorporated into the SGS devices. The conductive levels may be electrically coupled with one another (ganged together) to be incorporated into long-channel SGS devices. If multiple of the conductive levels are incorporated into the SGS devices, the out-diffused dopant may extend upwardly across two or more of the conductive levels 48 which are incorporated into the SGS devices.

The memory cells 90 (e.g., NAND memory cells) are vertically-stacked one atop another. Each of the memory cells comprises a region of the semiconductor material (channel material) 58, and comprises regions (control gate regions) of the conductive levels 48. The regions of the conductive levels 48 which are not comprised by the memory cells 90 may be considered to be wordline regions (routing regions) which couple the control gate regions with driver circuitry and/or with other suitable circuitry. The memory cells 90 comprise the cell materials (e.g., the tunneling material, charge-storage material, dielectric-barrier material and charge-blocking material) within the regions 64.

In some embodiments, the conductive levels 48 associated with the memory cells 90 may be referred to as wordline/control gate levels (or memory cell levels), in that they include wordlines and control gates associated with vertically-stacked memory cells of NAND strings. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

The conductive materials 18, 44 and 80 together form a source structure 94 (i.e., the stack 16 of FIG. 19 may be considered to correspond to a source structure). The source structure may be analogous to the source structures 216 described in the "Background" section. The source structure is shown to be coupled with control circuitry (e.g., CMOS) 96. The control circuitry may be under the source structure 94 (as shown), or may be in any other suitable location. A conductive material of the source structure 94 may be coupled with the control circuitry (e.g. CMOS 96) at any suitable process stage.

The source structure 94 of FIG. 19 includes the conductive material 18 (which may be a conductively-doped semiconductor material, and which may be referred to as a first conductively-doped semiconductor material), includes one or more of the first layers 20, includes the conductively-doped semiconductor material 80 (which may be referred to as a second conductively-doped semiconductor material), includes one or more of the second layers 42, and includes the conductive material 44 (which may be a conductively-doped semiconductor material, and which may be referred to as a third conductively-doped semiconductor material).

The source structure 94 also includes blocks 98 which extend through the conductively-doped semiconductor material 80, and which correspond to the doped regions 36 of material 22.

In some embodiments, the materials 18, 80 and 44 may be a same composition as one another; and may, for example, comprise, consist essentially of, or consist of conductively-doped silicon. In some embodiments, at least one of the materials 18, 80 and 44 may be a different composition relative to one another the materials 18, 80 and 44.

Figure 20:
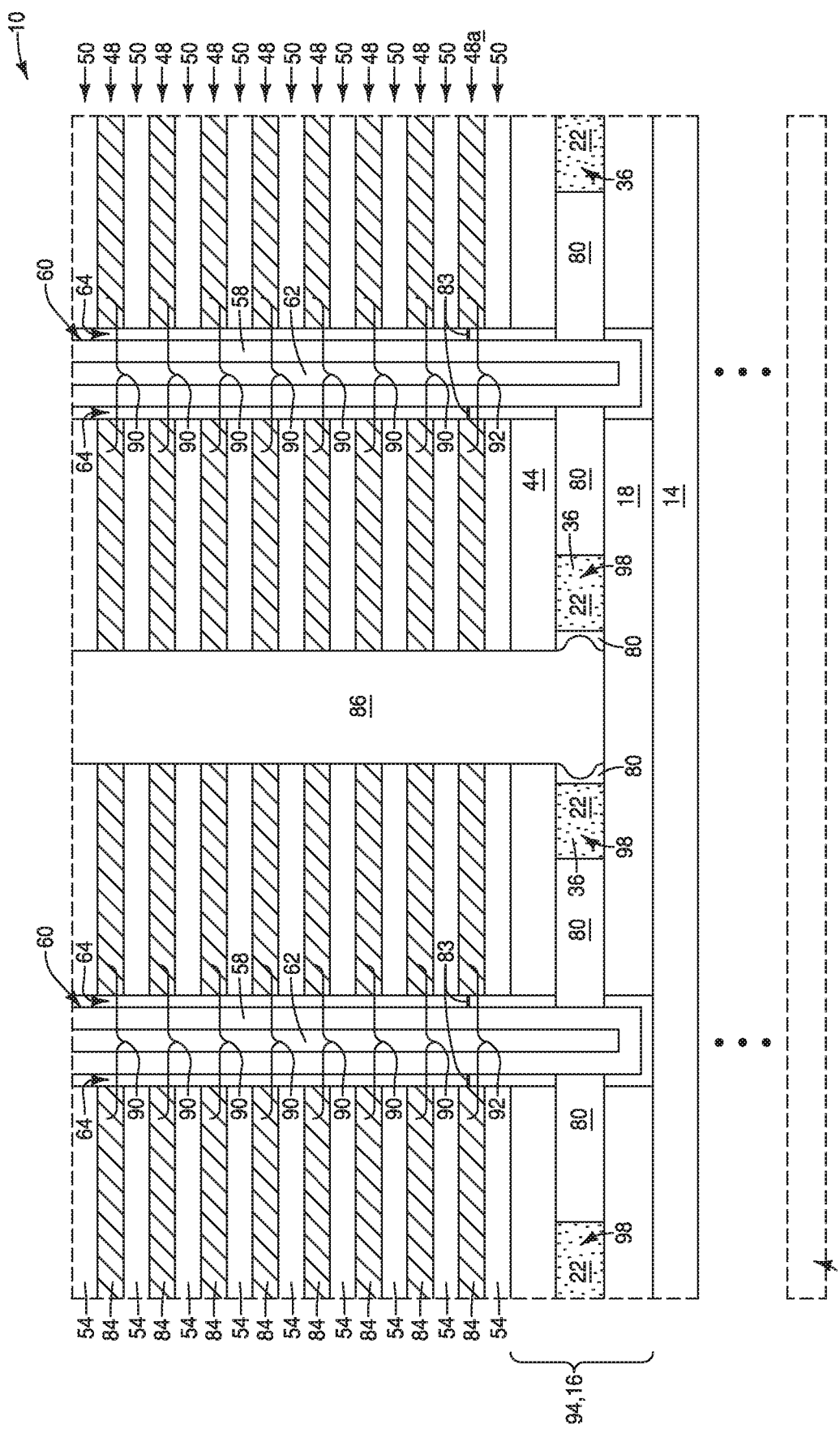
FIG. 20 is a diagrammatic cross-sectional side view of another example integrated assembly.

In the illustrated embodiment, the source structure 94 includes the layers 20a-c and the layers 42a-c. Such layers may be insulative, and may be kept thin enough so that they do not significantly degrade electrical conductivity of the source structure 94. Further, one or more of the layers may be omitted, and in some embodiments all of the layers may be omitted so that the conductive materials 18, 80 and 44 directly contact one another (as shown in FIG. 20). Alternatively, one or more of the layers 20a-c and 42a-c may be electrically conductive, and may thereby enhance conductively of the source structure 94.

In some embodiments, the channel-material-pillars 60 may be considered to be representative of a large number of substantially identical channel-material-pillars extending across the assembly 10; with the term "substantially identical" meaning identical to within reasonable tolerances of fabrication and measurement. The top-down view of FIG. 19A shows the pillars 60 arranged within a matrix (with the pillars 60 being hexagonally-packed in the illustrated embodiment), and shows the slit 74 extending through the matrix of the channel-material-pillars. In some embodiments, the slit 74 may divide the pillars between a first block region 102 and a second block region 104. Accordingly, the memory cells 90 on one side of the slit 74 may be considered to be within the first block region 102, and the memory cells 90 on the other side of the slit 74 may be considered to be within the second block region 104. The block regions 102 and 104 may be analogous to the memory blocks (or memory sub-blocks) described above in the "Background" section of this disclosure.

An advantage of the processing described herein is that the supporting blocks 98 may assist in supporting the various materials and structures provided over such blocks during the processing in which the material 52 of FIG. 18 is removed and replaced with the conductive material 84. Such may advantageously alleviate bending, toppling, crushing and/or other undesired physical changes that may otherwise occur in the absence of the supporting blocks 98.

In some embodiments, the assemblies 10 of FIGS. 19 and 20 may be considered to be examples of memory devices (i.e., flash memory devices, NAND memory arrays, NAND memory configurations, etc.).

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a source structure. The source structure includes, in ascending order, a first conductively-doped semiconductor material, one or more first insulative layers, a second conductively-doped semiconductor material, one or more second insulative layers, and a third conductively-doped semiconductor material. The source structure further including blocks extending through the second conductively-doped semiconductor material. Vertically-stacked conductive levels are over the source structure. The conductive levels include memory cell levels. Channel material extends vertically along the memory cell levels, and extends into the source structure to be in direct contact with the second conductively-doped semiconductor material. One or more memory cell materials are between the channel material and the vertically-stacked conductive levels.

Some embodiments include a method of forming an integrated assembly. A first stack is formed to comprise a second material over a first material. The first material is electrically conductive. Second regions of the second material are doped while leaving first regions of the second material undoped. The first regions extend laterally around the second regions. A second stack is formed over the first stack. The second stack has alternating first and second levels. First openings are formed to extend through the first and second stacks. Cell materials are formed within the first openings to line the first openings. The cell materials include charge-storage material and insulative material. Channel material is formed within the lined first openings and is spaced from the charge-storage material by the insulative material. A second opening is formed to pass through the second stack and to a first region of the second material. The first regions are selectively removed relative to the second regions. The removing of the first regions forms conduits that pass around the second regions, and that pass from the second opening to the cell materials. The conduits are extended through the cell materials and to the channel material. Doped semiconductor material is formed within the extended conduits. Dopant is out-diffused from the doped semiconductor material into the channel material. The out-diffused dopant extends upwardly to at least one of the first levels. Conductive material is formed within the first levels.

Some embodiments include a method of forming an integrated assembly. A first stack is formed to comprise a first material, at least one first layer over the first material, and a second material over said at least one first layer. The first material is electrically conductive. Second regions of the second material are doped while leaving first regions of the second material undoped. The first regions extend laterally around the second regions. At least one second layer is formed over the second material, and a third material is formed over said at least one second layer. The first stack comprises the third material and the at least one second layer. The third material is electrically conductive. A second stack is formed over the first stack. The second stack has alternating first and second levels. First openings are formed to extend through the first and second stacks. Cell materials are formed within the first openings to line the first openings. The cell materials include charge-storage material and insulative material. Channel material is formed within the lined first openings and is spaced from the charge-storage material by the insulative material. A second opening is formed to pass through the second stack and to a first region of the second material. The first regions of the second material are selectively removed relative to the second regions of the second material. The removing of the first regions of the second material forms conduits to the cell materials. The conduits are extended through the cell materials and to the channel material. Doped semiconductor material is formed within the extended conduits. Dopant is out-diffused from the doped semiconductor material into the channel material. The out-diffused dopant extends upwardly to at least one of the first levels. Conductive material is formed within the first levels.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a source structure comprising a first conductively-doped semiconductor material, one or more first insulative layers over the first conductively-doped semiconductor material, a second conductively-doped semiconductor material over the one or more first insulative layers, one or more second insulative layers over the second conductively-doped semiconductor material, and a third conductively-doped semiconductor material over the one or more second insulative layers; the source structure further including blocks extending through the second conductively-doped semiconductor material;
vertically-stacked conductive levels over the source structure; the conductive levels comprising memory cell levels;
channel material extending vertically along the memory cell levels, and extending into the source structure to be in direct contact with the second conductively-doped semiconductor material; and
one or more memory cell materials between the channel material and the vertically-stacked conductive levels.

2. The integrated assembly of claim 1 wherein upper conductive levels of the vertically-stacked conductive levels are the memory cell levels, and wherein a lower conductive level of the vertically-stacked conductive levels is a select device level.

3. The integrated assembly of claim 1 wherein the first, second and third conductively-doped semiconductor materials are a same composition as one another.

4. The integrated assembly of claim 3 wherein the first, second and third conductively-doped semiconductor materials comprise conductively-doped silicon.

5. The integrated assembly of claim 1 wherein the blocks comprise doped silicon.

6. The integrated assembly of claim 1 wherein the blocks comprise silicon doped with one or more elements selected from Groups 13-15 of the periodic table.

7. The integrated assembly of claim 6 wherein the said one or more elements selected from Groups 13-15 of the periodic table are present to a total concentration within a range of from about $1\times10^{18}$ atoms/cm$^3$ to about $1\times10^{21}$ atoms/cm$^3$.

8. The integrated assembly of claim 1 wherein the blocks comprise silicon doped with boron.

9. The integrated assembly of claim 1 wherein the blocks comprise silicon doped with carbon.

10. The integrated assembly of claim 1 wherein the conductive levels comprise metal.

11. The integrated assembly of claim 10 wherein the conductive levels are spaced from one another by intervening levels comprising silicon dioxide.

12. The integrated assembly of claim 1 wherein the blocks are spaced from the channel material.

13. The integrated assembly of claim 1 wherein the blocks are contained entirely within the second conductively-doped semiconductor material.

14. The integrated assembly of claim 1 wherein the blocks directly contact the second conductively-doped semiconductor material.

15. The integrated assembly of claim 14 wherein the second conductively-doped semiconductor material comprises one or more of silicon, germanium, III/V semiconductor material, gallium phosphide and semiconductor oxide.

16. The integrated assembly of claim 14 wherein the second conductively-doped semiconductor material comprises silicon which is heavily doped.

17. The integrated assembly of claim 16 wherein the silicon heavily doped is doped to a concentration of at least about $10^{22}$ atoms/cm$^3$ with n-type dopant.

18. The integrated assembly of claim 17 wherein the n-type dopant comprises phosphorus.

19. The integrated assembly of claim 1 wherein the blocks comprise opposite sides, the opposite sides directly contacting the same material.

20. The integrated assembly of claim 19 wherein the same material comprises semiconductor material.

21. The integrated assembly of claim 19 wherein the same material comprises conductively-doped semiconductor material.

22. The integrated assembly of claim 20 wherein the semiconductor material comprises one or more of silicon, germanium, III/V semiconductor material, gallium phosphide and semiconductor oxide.

23. The integrated assembly of claim 20 wherein the semiconductor material comprises silicon which is heavily doped.

24. The integrated assembly of claim 23 wherein the silicon heavily doped is doped to a concentration of at least about $10^{22}$ atoms/cm$^3$ with n-type dopant.

25. The integrated assembly of claim 24 wherein the n-type dopant comprises phosphorus.

26. The integrated assembly of claim 1 wherein each block comprises an upper side opposite a lower side, the upper and lower sides directly contacting identical material.

27. The integrated assembly of claim 26 wherein the identical material comprises insulative material.

28. The integrated assembly of claim 27 wherein the insulative material comprises silicon nitride.

* * * * *